US010163707B2

(12) United States Patent
Chang et al.

(10) Patent No.: US 10,163,707 B2
(45) Date of Patent: Dec. 25, 2018

(54) METHOD FOR FORMING GROUP III-V DEVICE STRUCTURE

(71) Applicant: Taiwan Semiconductor Manufacturing Co., Ltd., Hsinchu (TW)

(72) Inventors: Ming-Hong Chang, Hsinchu (TW); Hsin-Chih Lin, Hsinchu (TW); Shen-Ping Wang, Keelung (TW); Chung-Cheng Chen, Toufen (TW); Chien-Li Kuo, Hsinchu (TW); Po-Tao Chu, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 43 days.

(21) Appl. No.: 15/599,706

(22) Filed: May 19, 2017

(65) Prior Publication Data

US 2018/0337093 A1 Nov. 22, 2018

(51) Int. Cl.
*H01L 21/768* (2006.01)
*H01L 29/778* (2006.01)
*H01L 29/66* (2006.01)
*H01L 29/20* (2006.01)
*H01L 23/48* (2006.01)

(52) U.S. Cl.
CPC ...... *H01L 21/76898* (2013.01); *H01L 23/481* (2013.01); *H01L 29/2003* (2013.01); *H01L 29/66462* (2013.01); *H01L 29/7787* (2013.01)

(58) Field of Classification Search
CPC ............. H01L 21/76898; H01L 23/481; H01L 29/2003; H01L 29/66462; H01L 29/7787
See application file for complete search history.

(56) References Cited

U.S. PATENT DOCUMENTS

| | | | | |
|---|---|---|---|---|
| 8,003,525 | B2 * | 8/2011 | Okamoto | H01L 21/76898 257/E21.577 |
| 2011/0057235 | A1 * | 3/2011 | Shim | H01L 23/4824 257/194 |
| 2013/0240952 | A1 * | 9/2013 | Wong | H01L 29/66462 257/194 |
| 2016/0028367 | A1 * | 1/2016 | Shealy | H03H 3/02 310/321 |
| 2017/0062308 | A1 * | 3/2017 | Choi | H01L 23/481 |

* cited by examiner

*Primary Examiner* — Tom Thomas
*Assistant Examiner* — Benjamin Tzu-Hung Liu
(74) *Attorney, Agent, or Firm* — Birch, Stewart, Kolasch & Birch, LLP

(57) ABSTRACT

Methods for forming a group III-V device structure are provided. A method includes forming a first through via structure penetrating through group III-V compound layers over a front surface of a semiconductor substrate. The method also includes thinning the semiconductor substrate from a back surface of the semiconductor substrate. The method further includes etching the semiconductor substrate from the back surface to form a via hole substantially aligned with the first through via structure. In addition, the method includes etching the semiconductor substrate from the back surface to form a recess extending from a bottom surface of the recess towards the first through via structure. The first through via structure is exposed by the via hole and the recess. The method also includes forming a conductive layer in the via hole and the recess to form a second through via structure connected to the first through via structure.

20 Claims, 23 Drawing Sheets

METHOD FOR FORMING GROUP III-V DEVICE STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

In semiconductor technology, Group III-Group V (or Group III-V) semiconductor compounds are used to form various integrated circuit devices, such as high power field-effect transistors, high frequency transistors, high electron mobility transistors (HEMTs), or metal-insulator-semiconductor field-effect transistors (MISFETs). A Group III-V device structure has a number of attractive properties including high electron mobility and the ability to transmit signals at high frequencies.

Although existing Group III-V device structures have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
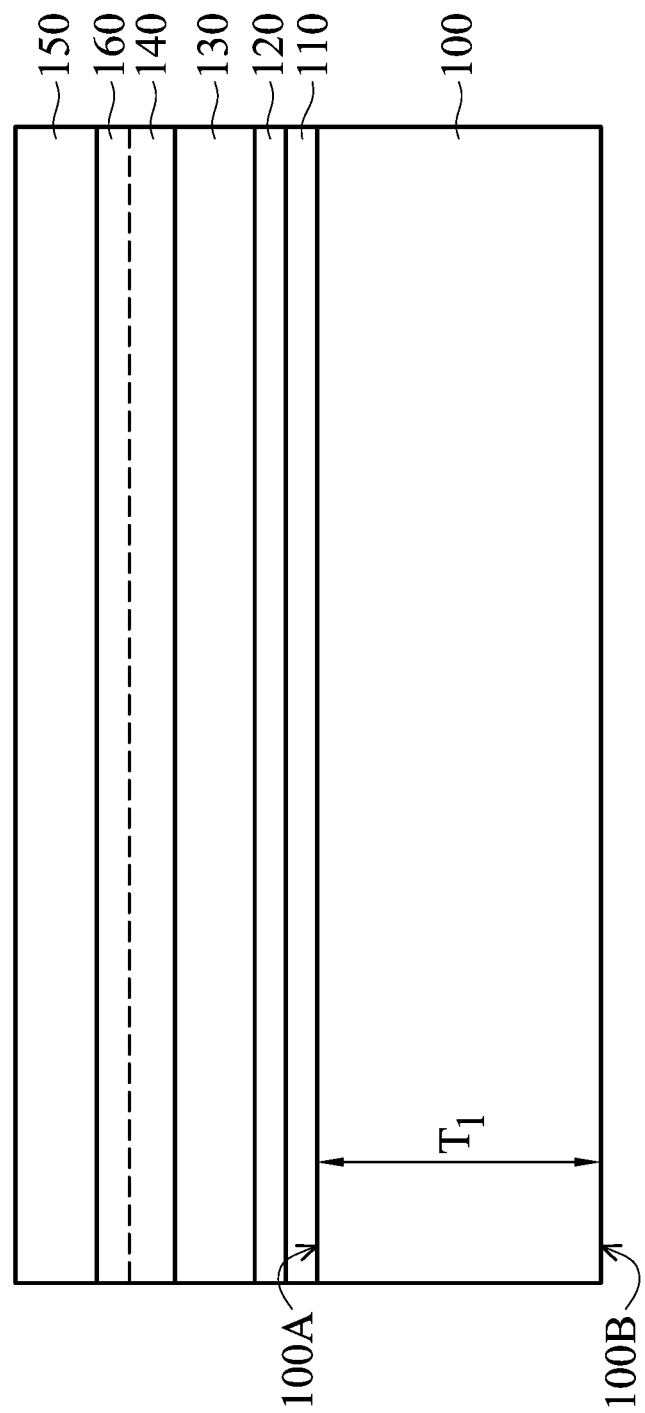
FIGS. 1A-1L are cross-sectional views of various stages of a process for forming a group III-V device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure relates to a semiconductor device including a through via structure, such as a through-substrate-via (TSV). The semiconductor device is a group III-V device. The group III-V device may be a field effect transistor incorporating a junction between two materials with different band gaps (i.e., a hetero-junction) as the channel instead of a doped region, as is generally the case for a metal oxide semiconductor field effect transistor (MOSFET). In some embodiments, the group III-V device is applied to a high-voltage device.

However, it should be noted that the group III-V device is only an example and is not a limitation to the disclosure. Embodiments of the disclosure can be applied to fabrication processes for any suitable semiconductor device including a through via structure. Embodiments of the disclosure are not limited and may be applied to fabrication processes for any suitable technology generation.

Some embodiments of the disclosure are described. Some of the features described below can be replaced or eliminated for different embodiments. Additional features can be added to the group III-V device structure. Additional operations can be provided before, during, and/or after the stages described in these embodiments. Some of the stages that are described can be replaced or eliminated for different embodiments. Although some embodiments are discussed with operations performed in a particular order, these operations may be performed in another logical order.

FIGS. 1A-1L are cross-sectional views of various stages of a process for forming a group III-V device structure, in accordance with some embodiments of the disclosure. As shown in FIG. 1A, a semiconductor substrate 100 is provided. The semiconductor substrate 100 includes a front surface 100A and a back surface 100B. The front surface 100A may be referred to as an active surface and the back surface 100B may be referred to as a non-active surface. In some embodiments, the semiconductor substrate 100 has an initial thickness $T_1$ that is in a range from about 800 micrometer (μm) to about 2000 μm.

In some embodiments, the semiconductor substrate 100 is a bulk semiconductor substrate, such as a semiconductor wafer. For example, the semiconductor substrate 100 is a silicon wafer. In some embodiments, the semiconductor substrate 100 is a silicon substrate having (111) lattice structure. The silicon (111) substrate provides an optimal lattice mismatch with an overlying layer, such as a GaN layer (which will be described in more detail later). The semiconductor substrate 100 may include another elementary semiconductor material such as germanium.

In some other embodiments, the semiconductor substrate 100 includes a compound semiconductor. The compound semiconductor may include silicon carbide (SiC), gallium arsenic (GaAs), indium arsenide (InAs), or indium phosphide (InP), another suitable compound semiconductor, or a combination thereof. In some embodiments, the semiconductor substrate 100 is made of an alloy semiconductor such as silicon germanium, silicon germanium carbide, gallium arsenic phosphide, or gallium indium phosphide. In some embodiments, the semiconductor substrate 100 includes a semiconductor-on-insulator (SOI) substrate. The SOI substrate may be fabricated using a wafer bonding process, a silicon film transfer process, a separation by implantation of oxygen (SIMOX) process, another applicable method, or a combination thereof.

Various processes are subsequently performed to form active device elements, such as transistors, over the semiconductor substrate 100. These various processes may be referred to as front-end-of-line (FEOL) semiconductor fabrication processes.

More specifically, multiple group III-V compound layers are deposited over the front surface 100A of the semiconductor substrate 100. In some embodiments, the group III-V compound layers include a nucleation layer, a transition layer, a buffer layer, a channel layer, and an active layer. The term of "group III-V" compound layers denotes a semiconductor material that includes at least one element from Group IIIA (group 13 under the modern International Union of Pure and Applied Chemistry (IUPAC)) and at least one element from Group VA (group 15 under the IUPAC) of the Periodic Table of Elements. Typically, the group III-V compound semiconductors are binary, ternary or quaternary alloys including III and V elements.

As shown in FIG. 1A, a nucleation layer 110 is deposited on the front surface 100A of the semiconductor substrate 100, in accordance with some embodiments. The nucleation layer 110 is used to compensate for a mismatch in lattice structures and/or a thermal expansion coefficient (TEC) between the semiconductor substrate 100 and an overlying layer, such as a transition layer (which will be described in more detail later). The nucleation layer 110 and the overlying transition layer may together be referred to as a transition structure. In some embodiments, the nucleation layer 110 includes a step-wise change in lattice structure.

In some embodiments, the nucleation layer 110 has a thickness that is in a range from about 100 angstrom (Å) to about 350 Å. In some embodiments, the nucleation layer 110 includes aluminum nitride (AlN) or another suitable nucleation material. In some embodiments, the nucleation layer 110 is deposited using an epitaxial growth process, another applicable process, or a combination thereof. Examples of epitaxial growth processes include, but are not limited to, a metal-organic chemical vapor deposition (MOCVD) process, a molecular beam epitaxy (MBE) process, and a hydride vapor phase epitaxy (HVPE) process.

As shown in FIG. 1A, a transition layer 120 is deposited on the nucleation layer 110, in accordance with some embodiments. The transition layer 120 is used to facilitate gradual changes of the lattice structure and TEC between the nucleation layer 110 and an overlying layer, such as a buffer layer (which will be described in more detail later).

In some embodiments, the transition layer 120 has a thickness that is in a range from about 0.5 μm to about 1.5 μm. In some embodiments, the transition layer 120 includes a graded aluminum gallium nitride layer ($Al_xGa_{1-x}N$), wherein x is the aluminum content ratio in the aluminum gallium constituent, and $0<x<1$. In some embodiments, the graded aluminum gallium nitride layer includes multiple layers each having a decreased x ratio (from a bottom layer adjoining the nucleation layer 110 to a top layer adjoining a buffer layer). In some embodiments, the graded aluminum gallium nitride layer has three layers having the x ratio in the range of 0.7-0.9 for the bottom layer, in the range of 0.4-0.6 for a middle layer, and in the range of 0.15-0.3 for the top layer. In some embodiments, instead of having multiple layers with different x ratios, the graded aluminum gallium nitride layer has a continuous gradient in the x ratio.

In some embodiments, the transition layer 120 is deposited using an epitaxial growth process, another applicable process, or a combination thereof. Examples of epitaxial growth processes include, but are not limited to, an MOCVD process, an MBE process, and a HVPE process.

As shown in FIG. 1A, a buffer layer 130 is deposited on the transition layer 120, in accordance with some embodiments. The buffer layer 130 is configured to define a high resistivity layer for increasing the breakdown voltage of the group III-V device structure. The buffer layer 130 has a higher resistivity than the resistivity of an overlying layer, such as a channel layer (which will be described in more detail later).

In some embodiments, the buffer layer 130 has a thickness that is in a range from about 0.5 μm to about 2.5 μm. In some embodiments, the buffer layer 130 includes one or more group III-V compound layers. Examples of group III-V compound layers include, but are not limited to, GaN, AlGaN, InGaN and InAlGaN. In some embodiments, the buffer layer 130 includes a dopant to achieve a predetermined high resistivity. In some embodiments, the dopant is a p-type dopant. In some embodiments, the buffer layer 130 includes GaN doped with the p-type dopant. Examples of the p-type dopant include, but are not limited to, carbon (C), iron (Fe), magnesium (Mg) and zinc (Zn).

In some embodiments, the buffer layer 130 is deposited using an epitaxial growth process, another applicable process, or a combination thereof. Examples of epitaxial growth processes include, but are not limited to, an MOCVD process, an MBE process, and a HVPE process.

As shown in FIG. 1A, a channel layer 140 is deposited on the buffer layer 130, in accordance with some embodiments. The channel layer 140 has a lower resistivity than the buffer layer 130, for improving current performance of the group III-V device structure.

In some embodiments, the channel layer 140 has a thickness that is in a range from about 0.2 μm to about 0.6 μm. In some embodiments, the channel layer 140 includes one or more group III-V compound layers. Examples of group III-V compound layers include, but are not limited to, GaN, AlGaN, InGaN and InAlGaN. One or more of the group III-V compound layers is doped. In some embodiments, the channel layer 140 includes alternatingly arranged p-doped and n-doped Group III-V compound layers. In some embodiments, the channel layer 140 includes a p-doped GaN layer. Examples of the p-type dopant in the p-doped GaN layer include, but are not limited to, C, Fe, Mg and Zn. In some other embodiment, the channel layer 140 includes an un-doped GaN layer. In some embodiments, the channel layer 140 is deposited using an epitaxial growth process, another applicable process, or a combination thereof.

As shown in FIG. 1A, an active layer 150 is deposited on the channel layer 140, in accordance with some embodiments. The active layer 150 is configured to cause a two dimensional electron gas (2DEG) 160 to be formed in the channel layer 140 along the interface between the active layer 150 and the channel layer 140.

In some embodiments, the active layer 150 includes one or more group compound layers. Examples of group III-V compound layers include, but are not limited to, AlGaN, InGaN and InAlGaN. In some embodiments, the active layer 150 is deposited using an epitaxial growth process, another applicable process, or a combination thereof.

A hetero-junction is formed between the active layer 150 and the channel layer 140. A band gap discontinuity exists between the active layer 150 and the channel layer 140. In some embodiments, the band gap of the active layer 150 is greater than the band gap of the channel layer 140. The electrons from a piezoelectric effect in the active layer 150 drop into the channel layer 140. As a result, a thin layer of highly mobile conducting electrons (i.e., the 2DEG 160) is created in the channel layer 140 and adjacent to the interface with the active layer 150. The electrons in the 2DEG 160 are charge carriers in the channel layer 140.

Due to the naturally occurring 2DEG 160 and without a gate structure, the group III-V device structure would be conductive without the application of a voltage to a gate structure (which will be described in more detail later). Therefore, the group III-V device structure would be a normally ON device with a negative threshold voltage. Such a normally ON state is a design concern in power applications where it is desirable to prevent, or substantially inhibit, current from flowing in or through the group III-V device structure.

Figure 1B:
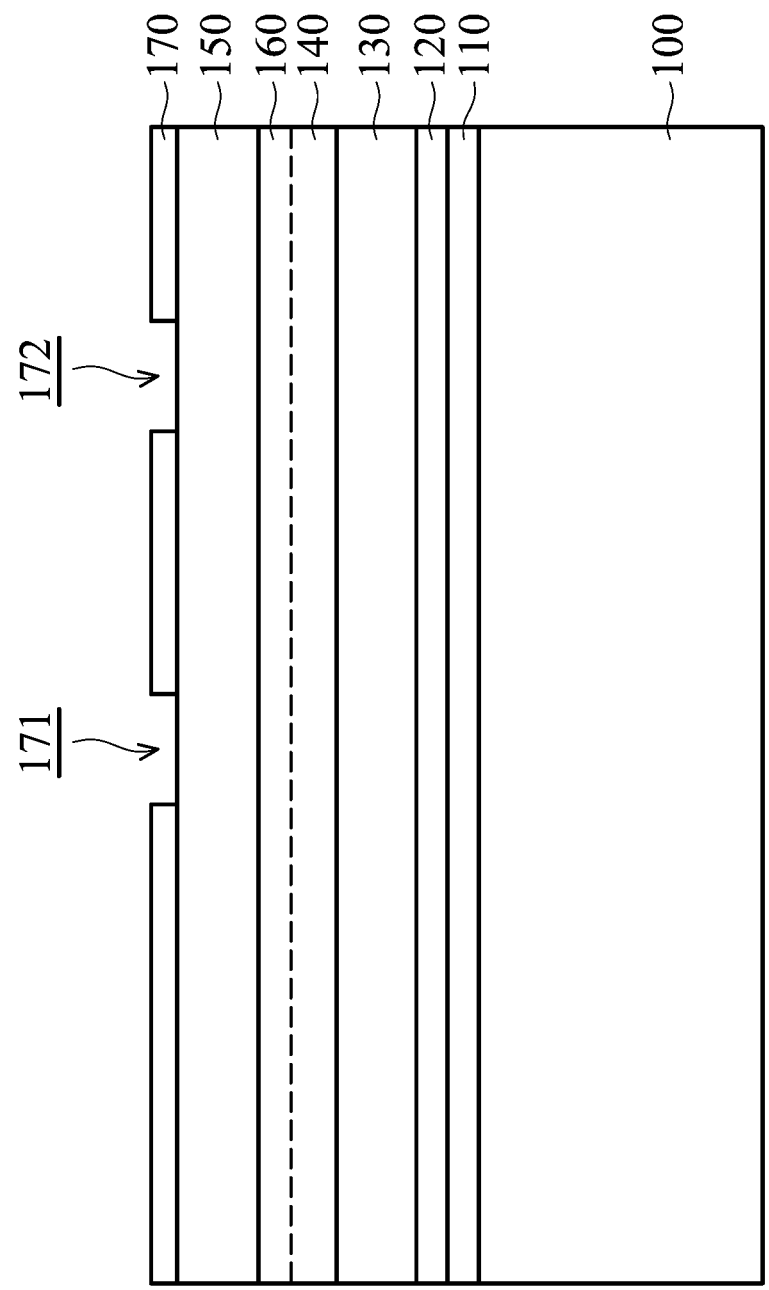

As shown in FIG. 1B, a dielectric layer 170 is deposited on the active layer 150, in accordance with some embodiments. In some embodiments, the dielectric layer 170 includes silicon oxide, silicon nitride, silicon oxynitride, borosilicate glass (BSG), phosphosilicate glass (PSG), borophosphosilicate glass (BPSG), fluorinated silicate glass (FSG), low-K material, porous dielectric material, another suitable dielectric material, or a combination thereof. The low-K material may have a dielectric constant smaller than that of silicon dioxide. In some embodiments, the dielectric layer 170 is deposited using a deposition process, such as a chemical vapor deposition (CVD) process, an atomic layer deposition (ALD) process, another applicable process, or a combination thereof.

Afterwards, a recess 171 and a recess 172 are formed in the dielectric layer 170 as shown in FIG. 1B in accordance with some embodiments. As a result, the top surface of the active layer 150 is partially exposed by the recess 171 and the recess 172. The recess 171 and the recess 172 are formed using photolithography and etching processes.

Figure 1C:
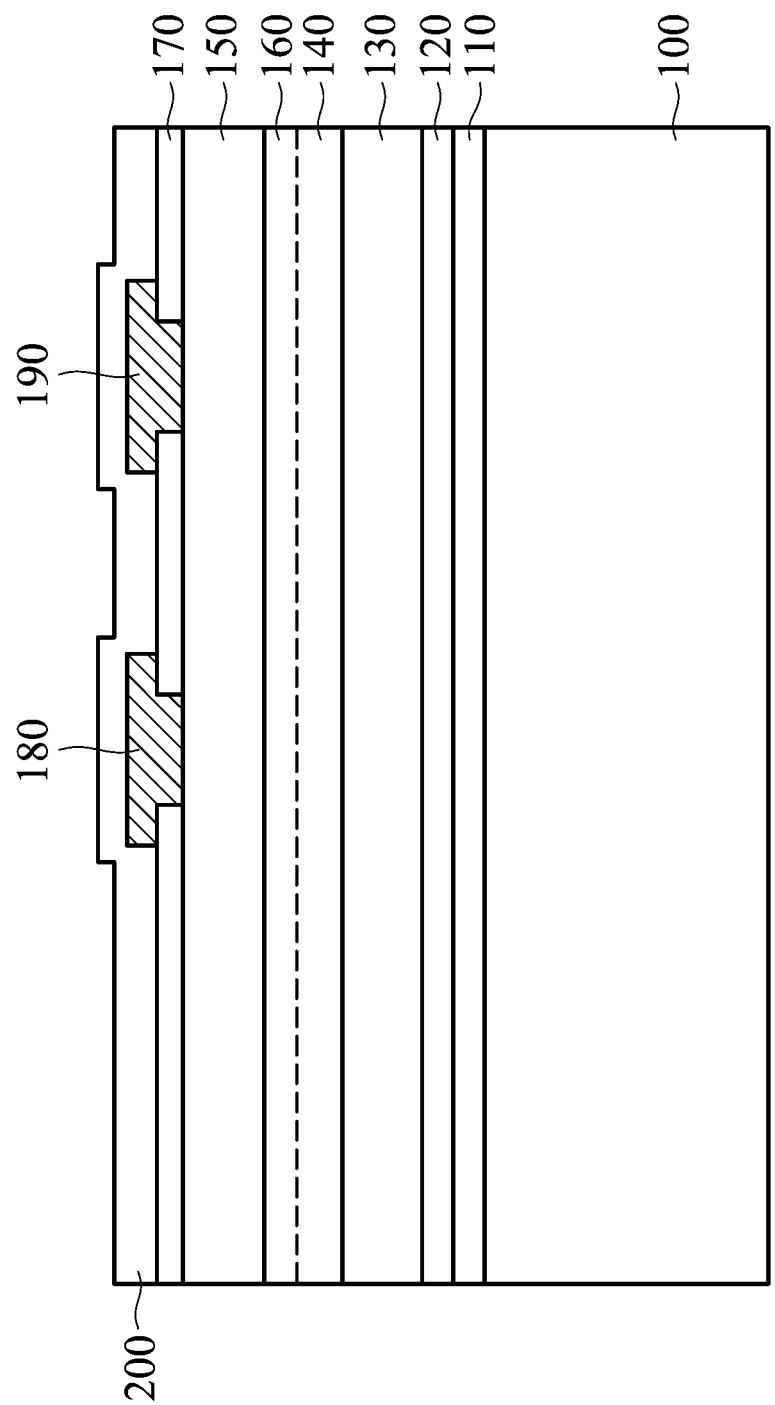

As shown in FIG. 1C, a source electrode 180 is formed in the recess 171 and a drain electrode 190 is formed in the recess 172, in accordance with some embodiments. The source electrode 180 and the drain electrode 190 are connected to the active layer 150. The source electrode 180 and the drain electrode 190 further cover the top surface of the dielectric layer 170. In some embodiments, the source electrode 180 includes or is made of Ti, Al, Ti, TaN, another suitable material, or a combination thereof. In some embodiments, the drain electrode 190 includes or is made of Ti, Al, Ti, TaN, another suitable material, or a combination thereof.

Afterwards, a dielectric layer 200 is deposited on the dielectric layer 170, as shown in FIG. 1C in accordance with some embodiments. The dielectric layer 200 covers the source electrode 180 and the drain electrode 190. In some embodiments, the dielectric layer 200 includes silicon oxide, silicon nitride, silicon oxynitride, BSG, PSG, BPSG, FSG, low-K material, porous dielectric material, another suitable dielectric material, or a combination thereof. In some embodiments, the dielectric layer 200 is deposited using a deposition process, such as a CVD process, an ALD process, another applicable process, or a combination thereof.

Figure 1D:
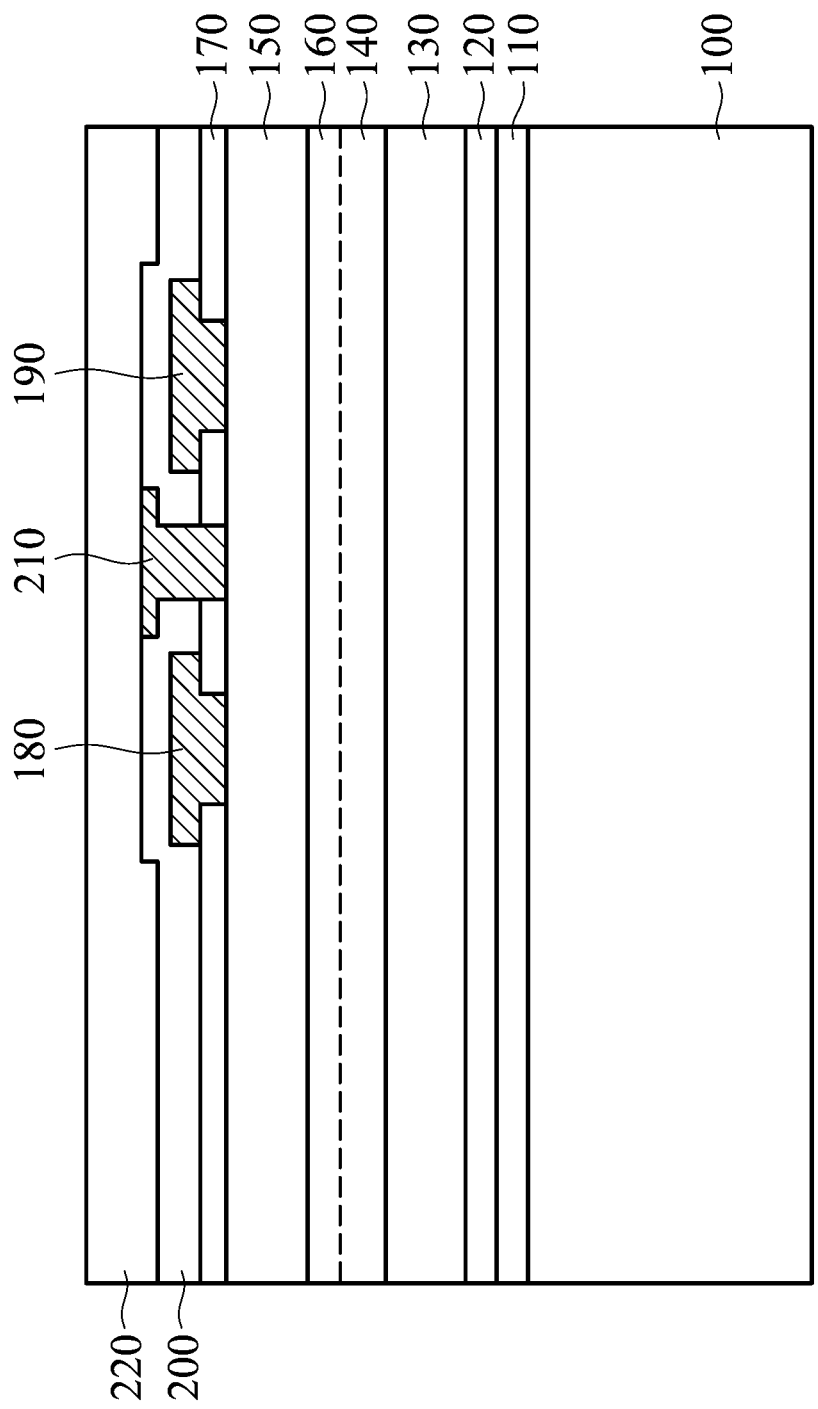

As shown in FIG. 1D, a gate electrode 210 is formed in the dielectric layer 170 and the dielectric layer 200, in accordance with some embodiments. The gate electrode 210 penetrates through the dielectric layer 170 and the dielectric layer 200 and is connected to the active layer 150. The gate electrode 210 is positioned between the source electrode 180 and the drain electrode 190.

In some embodiments, to convert a normally ON group III-V device structure to a normally OFF group III-V device structure, the gate electrode 210 over the active layer 150 is configured to deplete the 2DEG 160 under the gate electrode 210. The gate electrode 210 may be made of conductive materials, such as metal or alloy. In some embodiments, the gate electrode 210 includes TiN, Ti, AlCu, TiN, another suitable material, or a combination thereof. In some embodiments, the gate electrode 210 is made of TiN/Ti/AlCu/TiN.

An interconnection structure is subsequently formed to electrically connect to the source electrode 180 and the drain electrode 190. The interconnection structure includes multiple dielectric layers and multiple conductive features in the dielectric layers (which will be described in more detail later). The conductive features may include conductive contacts, conductive lines, conductive vias and/or conductive pads. In some embodiments, the conductive features of the interconnection structure include or are made of copper (Cu), Cu alloy, aluminum (Al), Al alloys, another suitable material, or a combination thereof. The interconnection structure is formed using various processes, such as back-end-of-line (BEOL) semiconductor fabrication processes.

More specifically, a dielectric layer 220 is deposited on the dielectric layer 210, as shown in FIG. 1D in accordance with some embodiments. The dielectric layer 220 covers the gate electrode 210. The dielectric layer 220 may be referred to as an interlayer dielectric (ILD) layer. In some embodiments, the dielectric layer 220 includes silicon oxide, silicon nitride, silicon oxynitride, BSG, PSG, BPSG, FSG, low-K material, porous dielectric material, another suitable dielectric material, or a combination thereof. In some embodiments, the dielectric layer 220 is deposited using a deposition process, such as a CVD process, an ALD process, another applicable process, or a combination thereof.

Figure 1E:
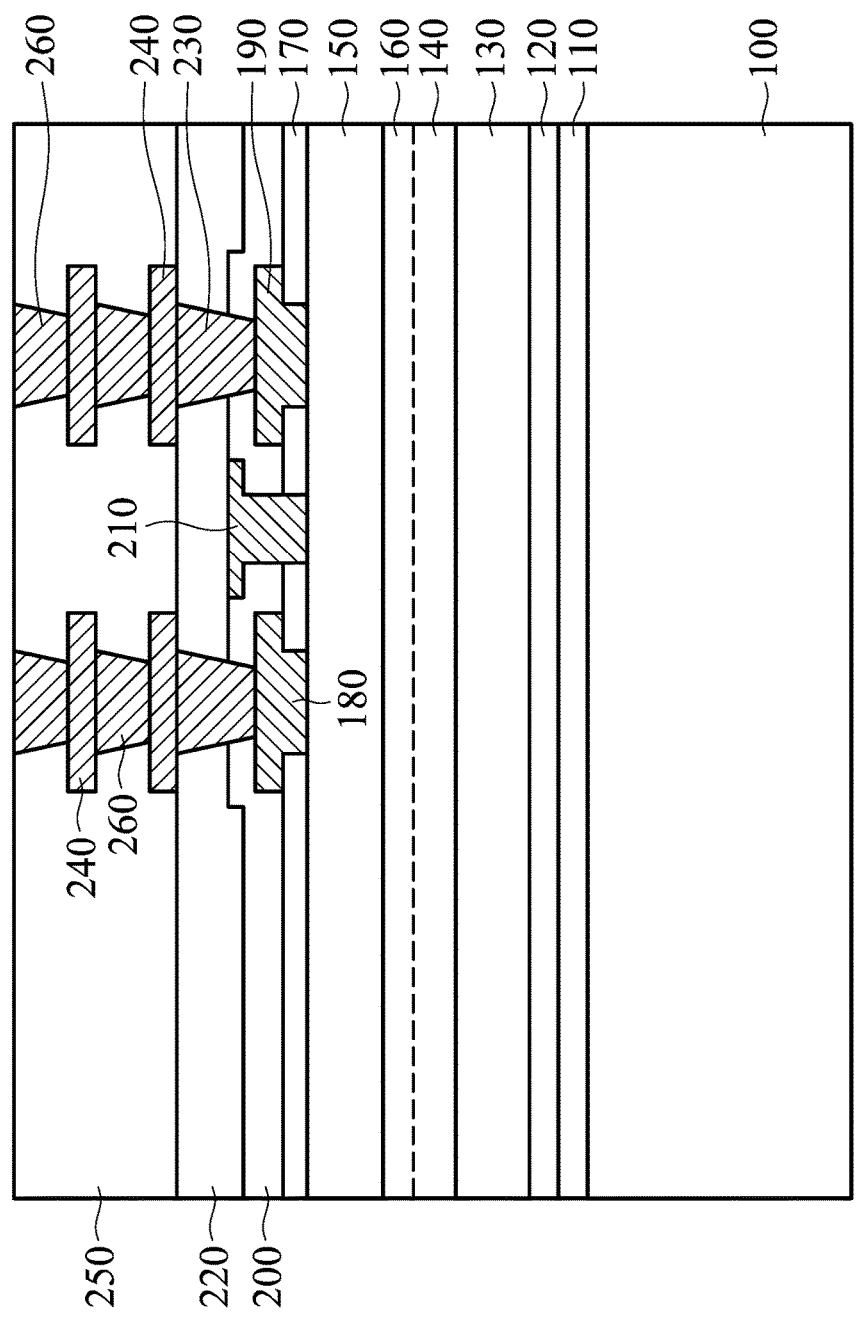

As shown in FIG. 1E, conductive contacts 230 are formed in the dielectric layer 200 and the dielectric layer 220, in accordance with some embodiments. The conductive contacts 230 penetrate through the dielectric layer 200 and the dielectric layer 220. One of the conductive contacts 230 is electrically and physically connected to the source electrode 180. Another of the conductive contacts 230 is electrically and physically connected to the drain electrode 190.

Afterwards, as shown in FIG. 1E, a dielectric layer 250 is formed over the dielectric layer 220, in accordance with some embodiments. The dielectric layer 250 includes multiple sub-dielectric layers which may be referred to as inter-metal dielectric (IMD) layers.

Multiple conductive layers 240 and multiple conductive vias 260 are formed in the dielectric layer 250. The conductive layers 240 and the conductive vias 260 are alternatively stacked over the dielectric layer 220. The bottommost conductive layer 240 is electrically and physically connected to the conductive contacts 230. The conductive vias 260 provide electrical connection between the conductive layers 240 at different levels. Each of the conductive layers 240 is a patterned conductive layer, which may include multiple conductive lines.

Figure 1F:
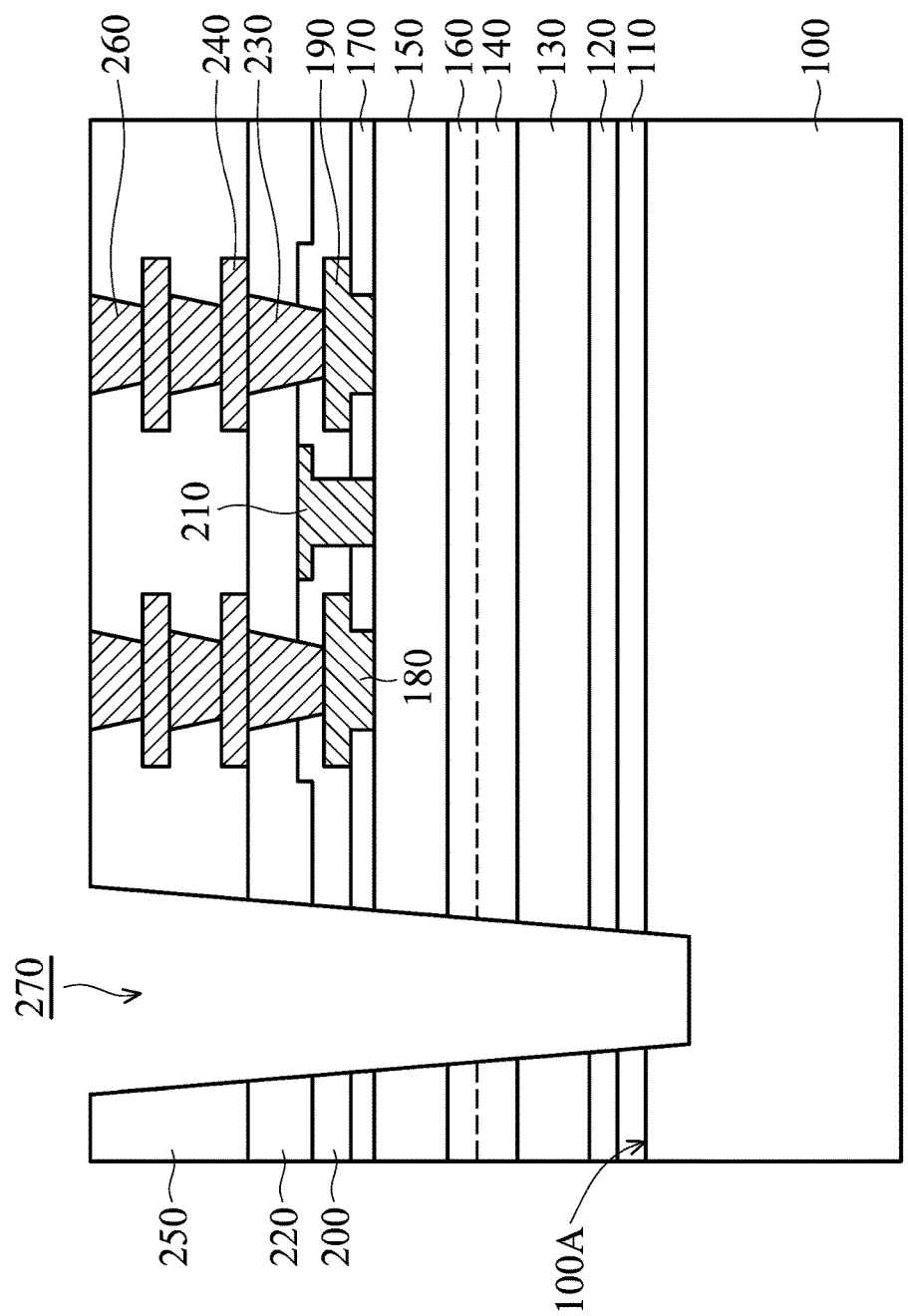

As shown in FIG. 1F, a trench 270 is formed to create a space for the formation of a though via structure, in accordance with some embodiments. In some embodiments, the trench 270 penetrates through the dielectric layers 250, 220, 200, and 170, the active layer 150, the channel layer 140, the buffer layer 130, the transition layer 120 and the nucleation layer 110. As a result, a portion of the semiconductor substrate 100 is exposed by the trench 270. In some embodiments, the trench 270 further extends into the semiconductor substrate 100. As a result, the bottom surface of the trench 270 is lower than the front surface 100A of the semiconductor substrate 100.

However, embodiments of the disclosure are not limited thereto. In some other embodiments, the trench 270 exposes the front surface 100A of the semiconductor substrate 100 without extending into the semiconductor substrate 100. As a result, the bottom surface of the trench 270 is level with the front surface 100A of the semiconductor substrate 100. In some embodiments, the trench 270 has a top opening that is wider than the bottom surface of the trench 270. In other words, the trench 270 has inclined sidewalls, but embodiments of the disclosure are not limited thereto.

The trench 270 is formed using photolithography and etching processes. The photolithography process includes photoresist coating (e.g., spin-on coating), soft baking, mask aligning, exposure, post-exposure baking, developing the photoresist, rinsing and drying (e.g., hard baking). The etching process includes a dry etching process, a wet etching process, or a combination thereof.

Figure 1G:
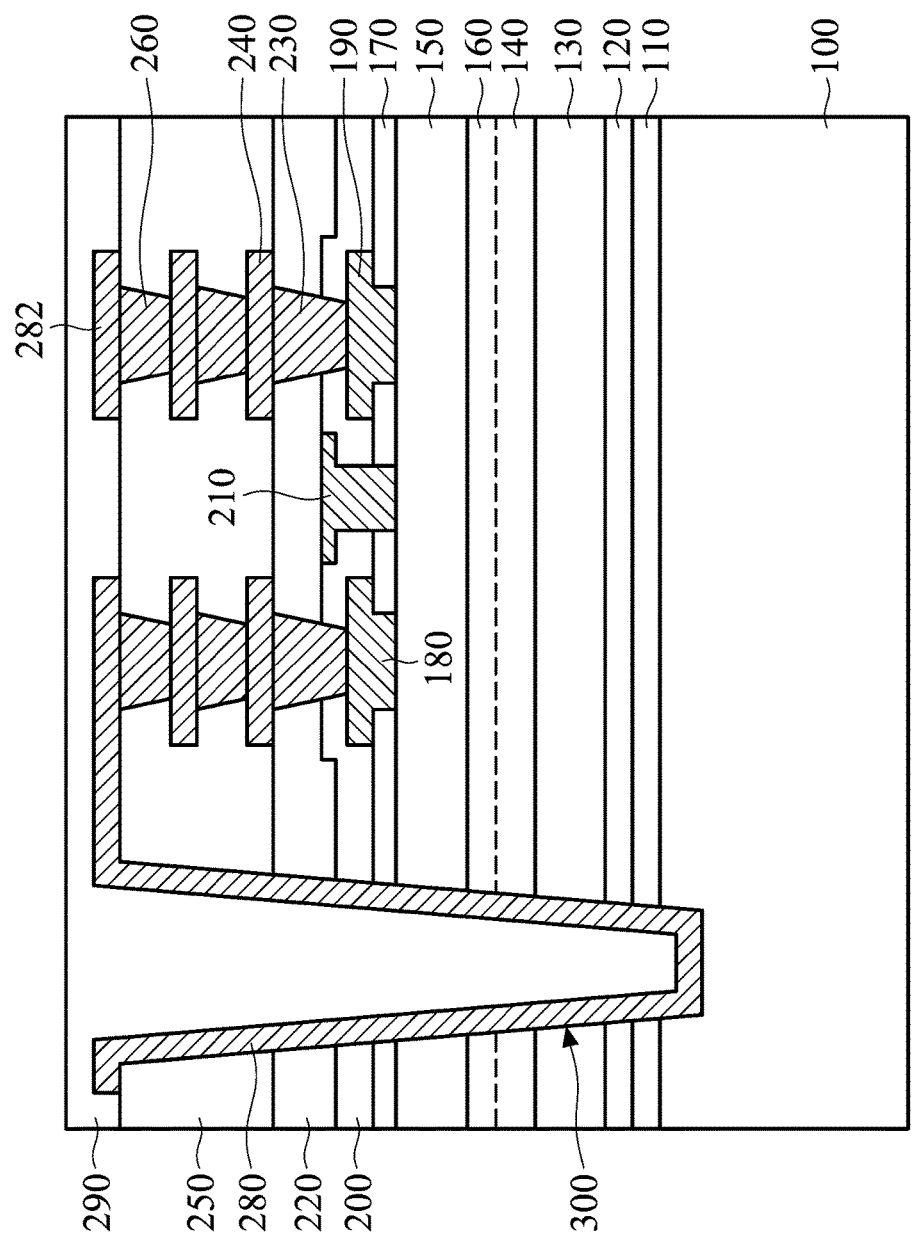

Afterwards, a patterned conductive material is formed over the dielectric layer 250 and fills the trench 270. The patterned conductive material forms a conductive layer 280 and a conductive layer 282, as shown in FIG. 1G. In some embodiments, the conductive material includes or is made of Cu, Cu alloy, Al, Al alloys, another suitable material, or a combination thereof. In some embodiments, the conductive material is deposited using an electroplating process, an electroless plating process, a sputtering process, or another applicable process. The conductive material may be patterned into the conductive layer 280 and the conductive layer 282 using photolithography and etching processes.

As shown in FIG. 1G, the conductive layer 280 is positioned over the dielectric layer 250 and extends in the trench 270, in accordance with some embodiments. The conductive layer 280 in the trench 270 forms a through via structure 300. In some embodiments, the through via structure 300 is also referred to as a through-GaN-via (TGV) since the trench 270 penetrates a GaN layer. In some embodiments, the through via structure 300 is formed during BEOL semiconductor fabrication processes.

In some embodiments, the conductive layer 280 is conformally formed on the sidewalls and the bottom surface of the trench 270. In some embodiments, the conductive layer 280 further extends on the conductive vias 260 and adjoins one of the conductive vias 260. As a result, the through via structure 300 is electrically connected to the source electrode 180 through the conductive vias 260, the conductive layers 240 and the conductive contacts 230. The through via structure 300 will be connected to ground so as to eliminate the background noise or background interference. Therefore, the semiconductor substrate 100 is grounded.

In some embodiments, the conductive layer 282 is positioned on the conductive vias 260 and adjoins one of the conductive vias 260. As a result, the conductive layer 282 is electrically connected to the drain electrode 190 through the conductive vias 260, the conductive layers 240 and the conductive contacts 230. The conductive layer 282 may be referred to as a topmost conductive layer of the interconnection structure. The conductive layer 282 is a patterned conductive layer, which may include multiple conductive lines.

Afterwards, as shown in FIG. 1G, a passivation layer 290 is deposited over the dielectric layer 250, in accordance with some embodiments. The passivation layer 290 covers the conductive layer 280 of the through via structure 300 and the conductive layer 282. The passivation layer 290 further fills in the trench 270 so that the conductive layer 280 and the passivation layer 290 together fill up the trench 270. In some embodiments, there is no recess in the passivation layer 290. As a result, the conductive layer 280 and the conductive layer 282 are not exposed from the passivation layer 290.

Figure 1H:
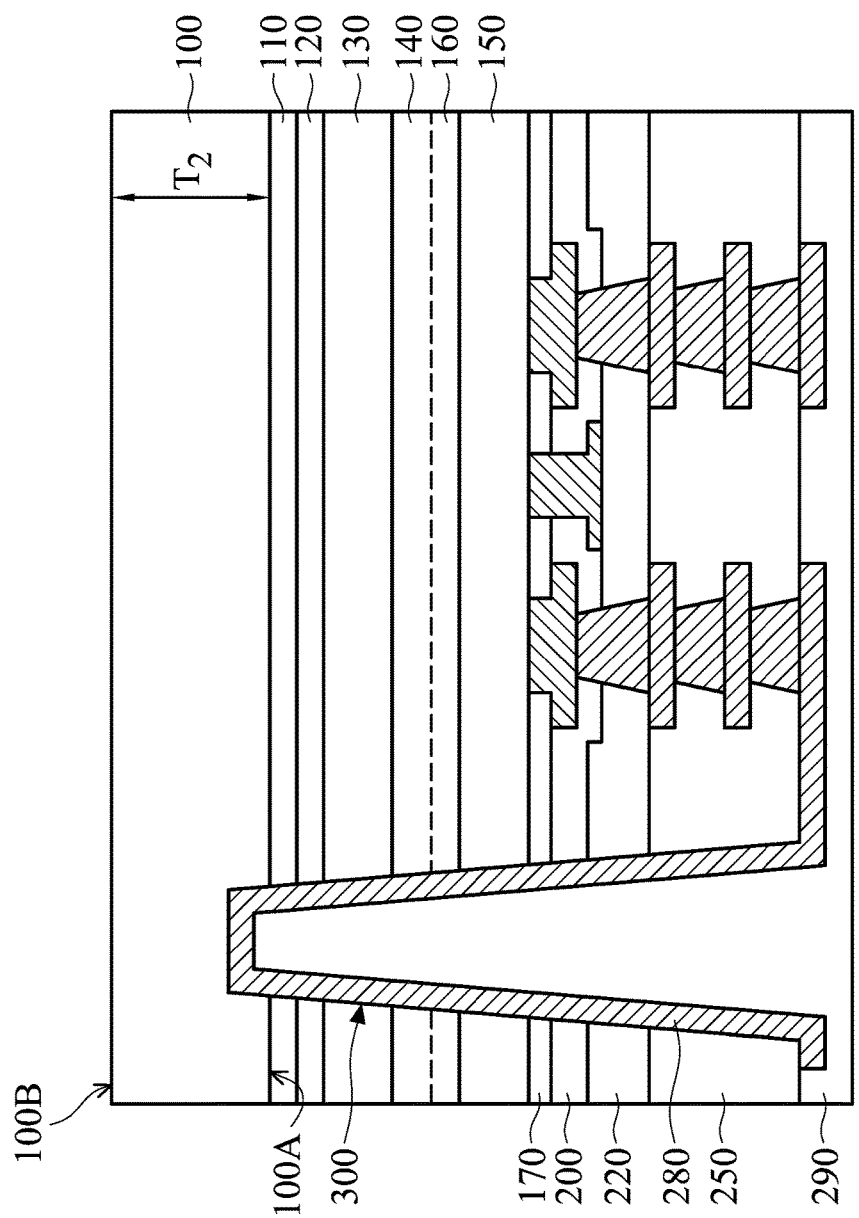

Subsequently, the structure shown in FIG. 1G is turned upside down and the semiconductor substrate 100 is thinned from its back surface 100B, as shown in FIG. 1H in accordance with some embodiments. A planarization process may be used to thin the semiconductor substrate 100 until the semiconductor substrate 100 has a smaller thickness $T_2$. In some embodiments, the thickness $T_2$ is in a range from about 150 μm to about 400 μm. In some embodiments, a ratio of the thickness $T_2$ to the thickness $T_1$ ($T_2/T_1$) is in a range from about 0.075 to about 0.5. The planarization process includes a grinding process, a chemical mechanical polishing (CMP) process, an etching process, another applicable process, or a combination thereof.

In some cases, a group III-V device includes a semiconductor substrate and a group III-V compound layer that have different lattice constants. When the semiconductor substrate is thin, warping or bending may be induced in the group III-V device due to lattice constant mismatch between the semiconductor substrate and the group compound layer. During the fabrication of the group device, the semiconductor substrate may be thinned to a desired thickness. Typically, the semiconductor substrate and the group III-V compound layer are bonded to a carrier substrate through an adhesive layer before thinning the semiconductor substrate so as to mitigate warping or bending in the group III-V device. This carrier substrate is temporary and will be removed. The thickness of the semiconductor substrate may be limited to avoid warping or bending.

In accordance with some embodiments of the disclosure, the structure shown in FIG. 1G does not need to be bonded to a carrier substrate since the thinned semiconductor substrate 100 has a sufficient thickness $T_2$, such as being greater than about 100 μm. With such thickness $T_2$, warping, bending or even cracking of the semiconductor substrate 100 is mitigated or eliminated. No carrier substrate, which may include a semiconductor material or a glass material, needs to be attached to the passivation layer 290 before the thinning of the semiconductor substrate 100. As a result, no adhesive layer is attached to the passivation layer 290, and no process for removing an adhesive layer and a carrier substrate (such as a de-bonding process) is performed after the thinning of the semiconductor substrate 100. Accordingly, the method for forming the group III-V device structure is simple and the fabrication cost is greatly reduced.

Afterwards, a step-like space (or cavity) is created in the semiconductor substrate 100 for the formation of a though via structure. The though via structure will provide electrical connection between the through via structure 300 and a package substrate (not shown), such as a lead frame. In some embodiments, the step-like space includes a via hole 320 and a recess (or cavity) 340, which will be described in more detail later. As a result, the semiconductor substrate 100 has a first portion remaining the thickness $T_2$ and a second portion having a smaller thickness due to the step-like space. With the thickness $T_2$, the group III-V device structure is prevented from warping, bending or cracking even without being bonded to a carrier substrate. With the smaller thickness, it becomes easier for the semiconductor substrate 100 to dissipate heat. Therefore, the reliability of the group III-V device structure is significantly enhanced.

Figure 1I:
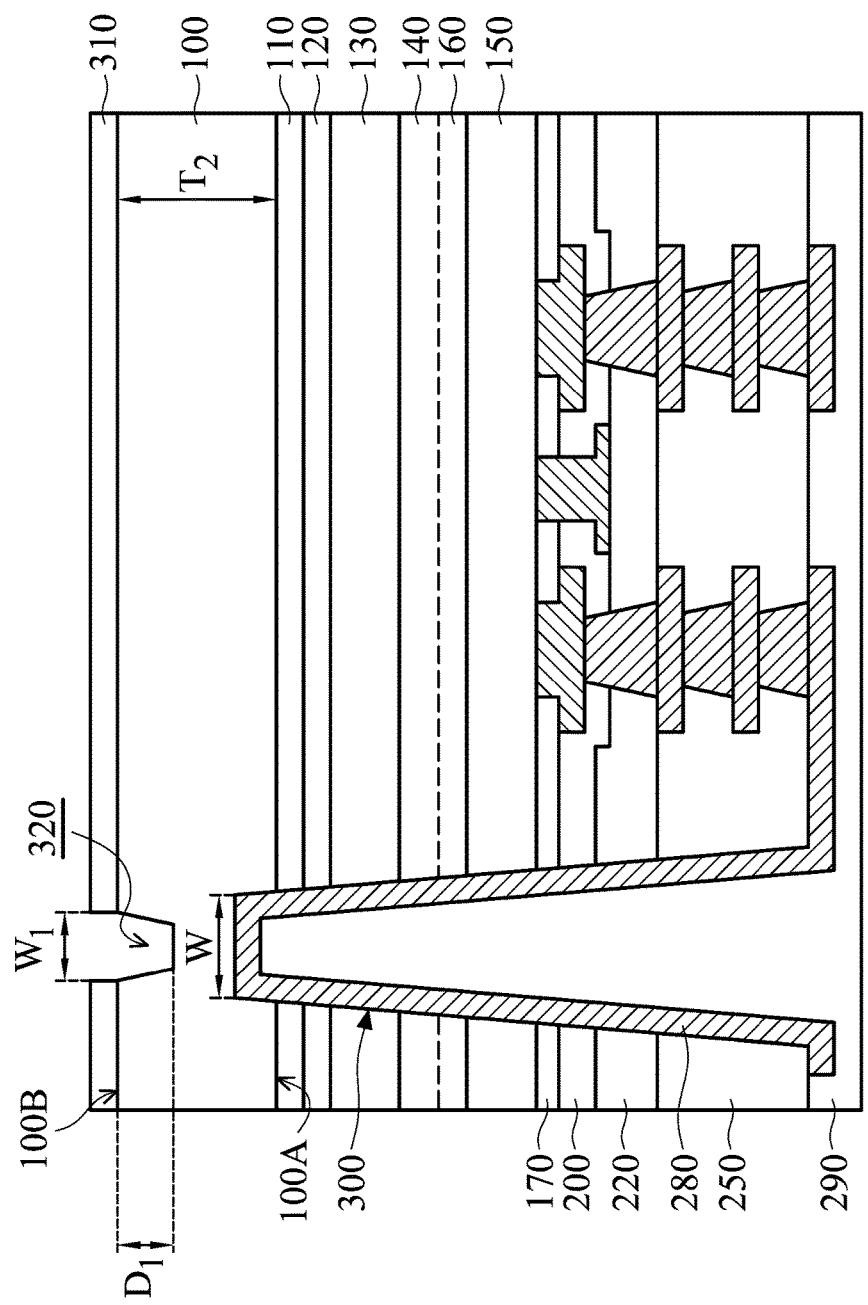

More specifically, as shown in FIG. 1I, a patterned mask layer 310 is formed over the back surface 100B of the semiconductor substrate 100, in accordance with some embodiments. The patterned mask layer 310 exposes a portion of the semiconductor substrate 100 that is substantially aligned with the through via structure 300. In some embodiments, the patterned mask layer 310 includes or is made of a photoresist material or another suitable material.

Afterwards, the portion of the semiconductor substrate 100 exposed from the patterned mask layer 310 is removed. As a result, as shown in FIG. 1I, the via hole 320 is formed in the semiconductor substrate 100. The patterned mask layer 310 is then removed. The via hole 320 is formed using photolithography and etching processes. The etching process includes a dry etching process, a wet etching process, or a combination thereof.

In some embodiments, the via hole 320 has a depth $D_1$ that is less than the thickness $T_2$ of the semiconductor substrate 100. In other words, the via hole 320 does not penetrate through the semiconductor substrate 100. In some embodiments, the via hole 320 is substantially aligned with the through via structure 300 but does not expose the through via structure 300.

However, embodiments of the disclosure are not limited thereto. In some other embodiments, the via hole 320 extends from the back surface 100B towards the front surface 100A of the semiconductor substrate 100 until the through via structure 300 is exposed. In some other embodiments, the via hole 320 penetrates through the semiconductor substrate 100 to expose the through via structure 300.

In some embodiments, the via hole 320 has a top opening that is wider than the bottom surface of the via hole 320. In other words, the via hole 320 has inclined sidewalls, but embodiments of the disclosure are not limited thereto. The top opening of the via hole 320 has a width $W_1$. In some embodiments, the width $W_1$ of the via hole 320 is less than a width W of the through via structure 300. However, embodiments of the disclosure are not limited thereto. In some other embodiments, the width $W_1$ of the via hole 320 is substantially equal to or greater than the width W of the through via structure 300.

Figure 1J:
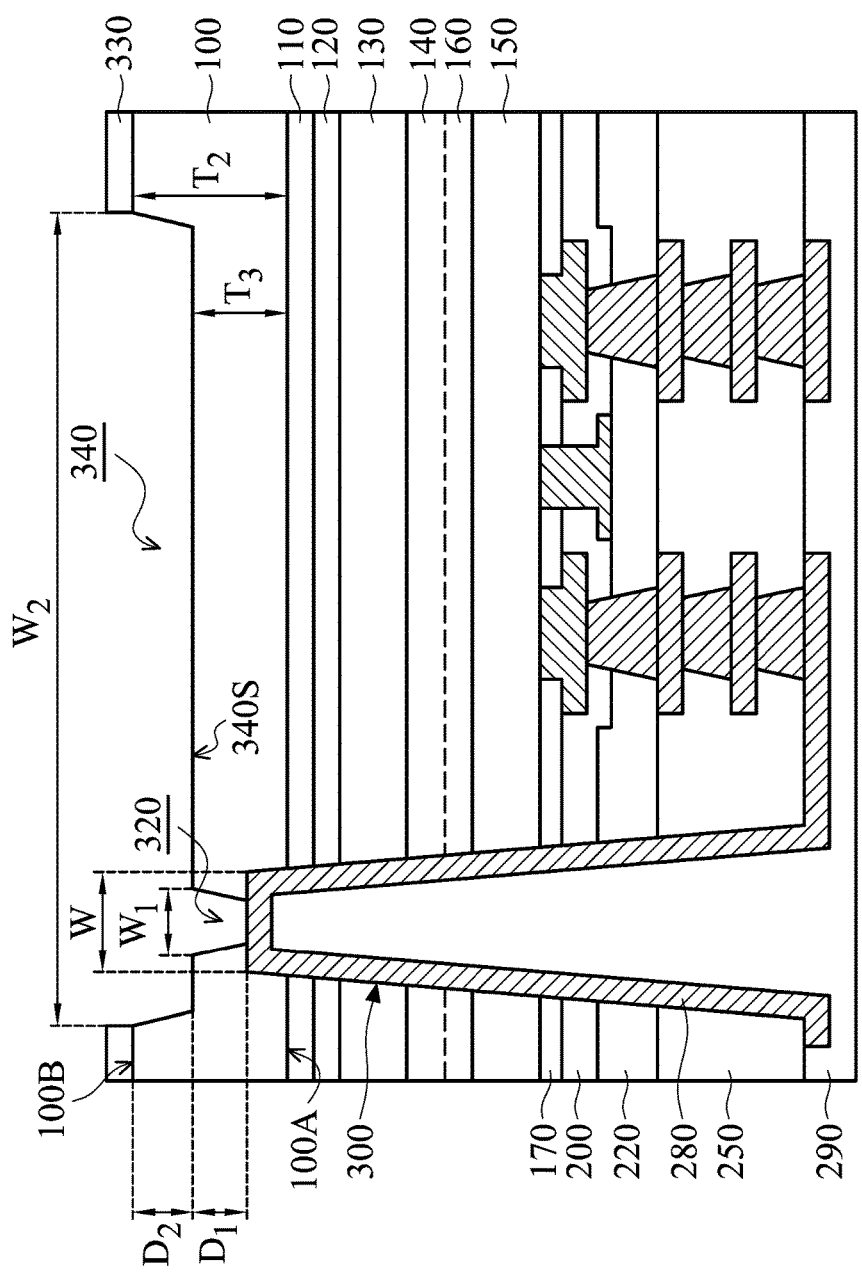

As shown in FIG. 1J, a patterned mask layer 330 is formed over the back surface 100B of the semiconductor substrate 100, in accordance with some embodiments. The patterned mask layer 330 exposes a portion of the semiconductor substrate 100 and the via hole 320. In some embodiments, the patterned mask layer 330 includes or is made of a photoresist material or another suitable material.

Afterwards, the portion of the semiconductor substrate 100 exposed from the patterned mask layer 330 is removed. As a result, as shown in FIG. 1J, the recess 340 is formed in the semiconductor substrate 100. The patterned mask layer 330 is then removed. The recess 340 is formed using photolithography and etching processes. The etching process includes a dry etching process, a wet etching process, or a combination thereof.

During the formation of the recess 340, since the patterned mask layer 330 exposes the via hole 320, a portion of the semiconductor substrate 100 under the via hole 320 is also removed. After the formation of the recess 340, the via hole 320 becomes extending from the bottom surface 340S of the recess 340 towards the through via structure 300. In other words, the recess 340 and the via hole 320 communicate with each other. The portion of the semiconductor substrate 100 covering the through via structure 300 is removed during the formation of the recess 340. As a result, the through via structure 300 becomes exposed from the via hole 320 and the recess 340.

In some embodiments, the recess 340 has a depth $D_2$ that is less than the thickness $T_2$ of a first portion of the semiconductor substrate 100. In other words, the recess 340 does not penetrate through the semiconductor substrate 100. In some embodiments, a second portion of the semiconductor substrate 100 under the recess 340 has a thickness $T_3$ that is measured from the bottom surface 340S of the recess 340 to the front surface 100A of the semiconductor substrate 100.

Since the second portion having thickness $T_3$ is thinner than the first portion having thickness $T_2$, the semiconductor substrate 100 has improved heat dissipation. On the other hand, since the semiconductor substrate 100 includes the first portion having sufficient thickness $T_2$, the thickness $T_3$ of the second portion can be reduced or fine-tuned to meet requirements without concern for defects that may be induced by lattice constant mismatch. Accordingly, heat dissipation from the semiconductor substrate 100 is enhanced even further. It is also more flexible to reduce the thickness of the semiconductor substrate 100.

In some embodiments, the thickness $T_3$ is in a range from about 20 µm to about 150 µm. In some embodiments, a ratio of the thickness $T_3$ to the thickness $T_2$ ($T_3/T_2$) is less than 1 and is substantially equal to or greater than 0.05. In some embodiments, the thickness $T_3$ of the semiconductor substrate 100 is greater than the depth $D_1$ of the via hole 320 and the depth $D_2$ of the recess 340.

As mentioned above, in some other embodiments, the through via structure 300 does not extend into the semiconductor substrate 100. In these embodiments, the sum of the depth $D_1$ of the via hole 320 and the depth $D_2$ of the recess 340 is substantially equal to the thickness $T_2$ of the semiconductor substrate 100. In these embodiments, the depth $D_1$ of the via hole 320 is substantially equal to the thickness $T_3$ of the semiconductor substrate 100.

Although FIG. 1J shows that the depth $D_2$ of the recess 340 is greater than the depth $D_1$ of the via hole 320, embodiments of the disclosure are not limited thereto. In some other embodiments, the depth $D_2$ of the recess 340 is substantially equal to or less than the depth $D_1$ of the via hole 320.

In some embodiments, the recess 340 has a top opening that is wider than the bottom surface 340S of the recess 340. In other words, the recess 340 has inclined sidewalls, but embodiments of the disclosure are not limited thereto. The top opening of the recess 340 has a width $W_2$. In some embodiments, the width $W_2$ of the recess 340 is greater than the width $W_1$ of the via hole 320 and the width W of the through via structure 300. In some embodiments, the via hole 320 overlaps the through via structure 300 while the recess 340 overlaps the through via structure 300, the source electrode 180, the gate electrode 210 and the drain electrode 190. In other words, the second portion of the semiconductor substrate 100 under the recess 340 overlaps the through via structure 300, the source electrode 180, the gate electrode 210 and the drain electrode 190. In some embodiments, the first portion of the semiconductor substrate 100 remaining the thickness $T_2$ does not overlap the through via structure 300, the source electrode 180, the gate electrode 210 and the drain electrode 190.

Although FIGS. 1I and 1J show that the recess 340 is formed after the formation of the via hole 320, embodiments of the disclosure are not limited thereto. In some other embodiments, the recess 340 is formed before the formation of the via hole 320.

Figure 1K:
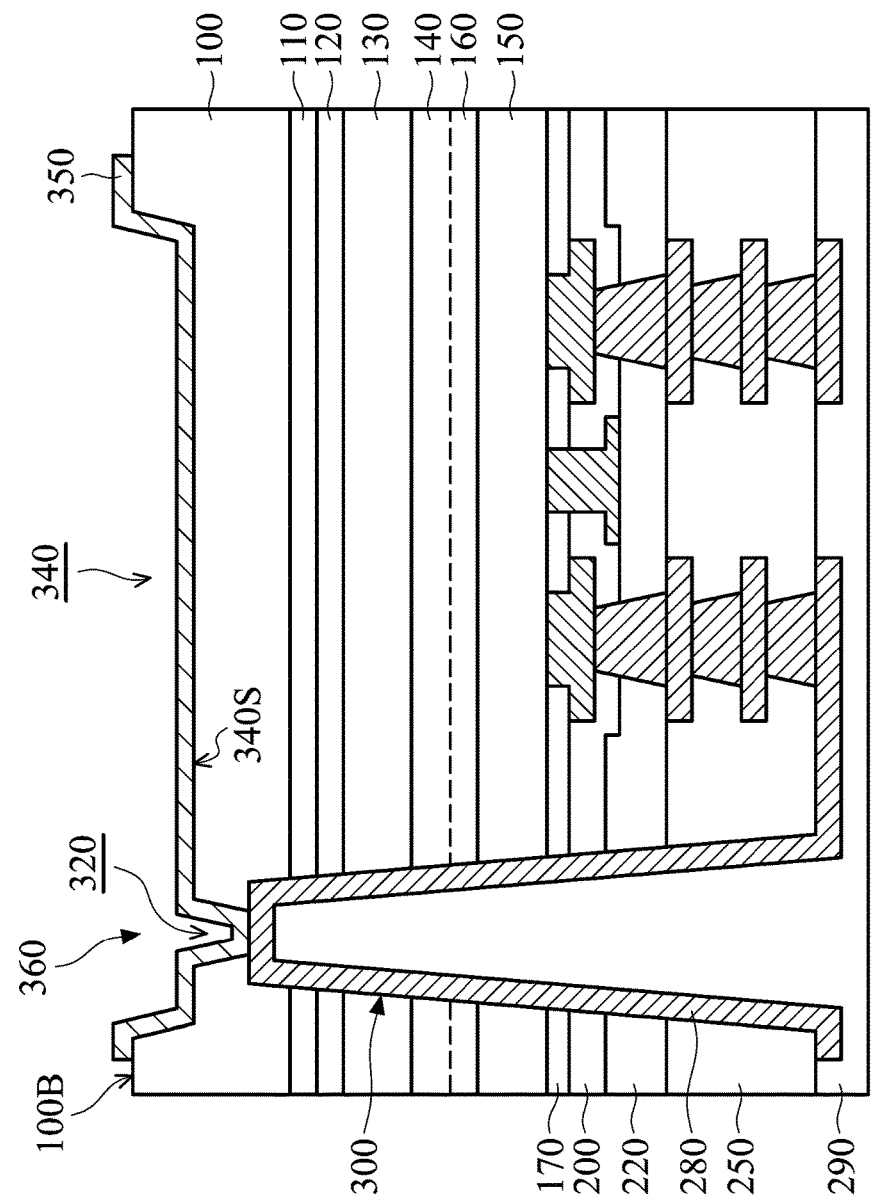

Afterwards, a patterned conductive layer 350 is formed over the back surface 100B of the semiconductor substrate 100 and fills the recess 340 and the via hole 320, as shown in FIG. 1K in accordance with some embodiments. The conductive layer 350 in the recess 340 and the via hole 320 forms a through via structure 360. The through via structure 360 may be referred to as a through-substrate-via (TSV) since the recess 340 and the via hole 320 together penetrate the semiconductor substrate 100. In some embodiments, the semiconductor substrate 100 is made of silicon so the through via structure 360 is also referred to as a through-silicon-via (TSV).

In some embodiments, the conductive layer 350 is conformally formed on the sidewalls and the bottom surfaces of the recess 340 and the via hole 320. As a result, the conductive layer 350 does not fill up the recess 340 and the via hole 320. The conductive layer 350 of the through via structure 360 is electrically connected to the source electrode 180 through the through via structure 300, the conductive vias 260, the conductive layers 240 and the conductive contacts 230.

In some embodiments, the conductive layer 350 includes or is made of Cu, Cu alloy, Al, Al alloys, another suitable material, or a combination thereof. In some embodiments, the conductive layer 350 is deposited using an electroplating process, an electroless plating process, a sputtering process, or another applicable process. The conductive layer 350 may be patterned using photolithography and etching processes.

Figure 1L:
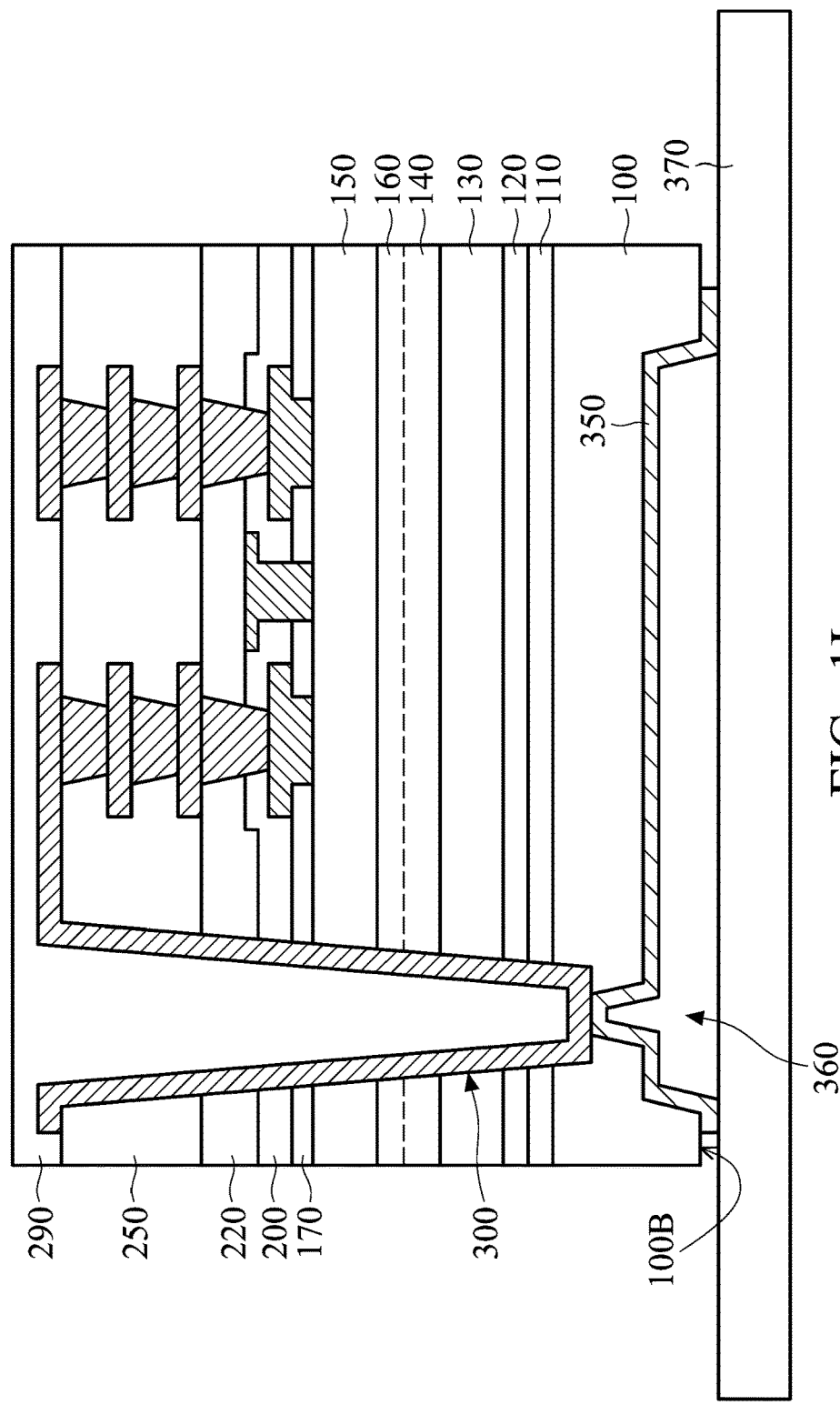

As shown in FIG. 1L, the structure shown in FIG. 1K is turned upside down and then is bonded or mounted onto a dicing tape 370, in accordance with some embodiments. The back surface 100B of the semiconductor substrate 100 faces the dicing tape 370. In some embodiments, the conductive layer 280 and the conductive layer 282 (shown in FIG. 1G) remain covered by the passivation layer 290.

Afterwards, a singulation process is performed over the dicing tape 370 to separate the wafer structure shown in FIG. 1K into multiple semiconductor dies (or chips), in accordance with some embodiments. In some embodiments, no de-bonding process is performed after the structure shown in FIG. 1K is bonded onto the dicing tape 370 and before the singulation process.

In some embodiments, a dicing process is performed along a direction from the passivation layer 290 towards the semiconductor substrate 100. In other words, the channel layer 140, the passivation layer 290, the dielectric layers 250, 220, 200, and 170, the active layer 150, the buffer layer 130, the transition layer 120, the nucleation layer 110, and the semiconductor substrate 100 are sequentially cut. The recess 340 is not cut during the dicing process.

Afterwards, each semiconductor die including the structure shown in FIG. 1K is bonded to a package substrate (not shown), in accordance with some embodiments. The package substrate includes a conductive feature (such as a metal sheet). The conductive layer 350 over the back surface 100B of the semiconductor substrate 100 in the semiconductor die may be bonded to the conductive feature of the package substrate through conductive glue. The semiconductor die and the conductive feature of the package substrate are electrically connected to each other by the conductive layer 350, rather than conductive wires which are formed using a wire bonding process. As a result, the inductance and the contact resistance of the group III-V device structure are reduced. The device performance of the group III-V device structure is improved. It also becomes easier to package the semiconductor die including the structure shown in FIG. 1K.

Figure 2:
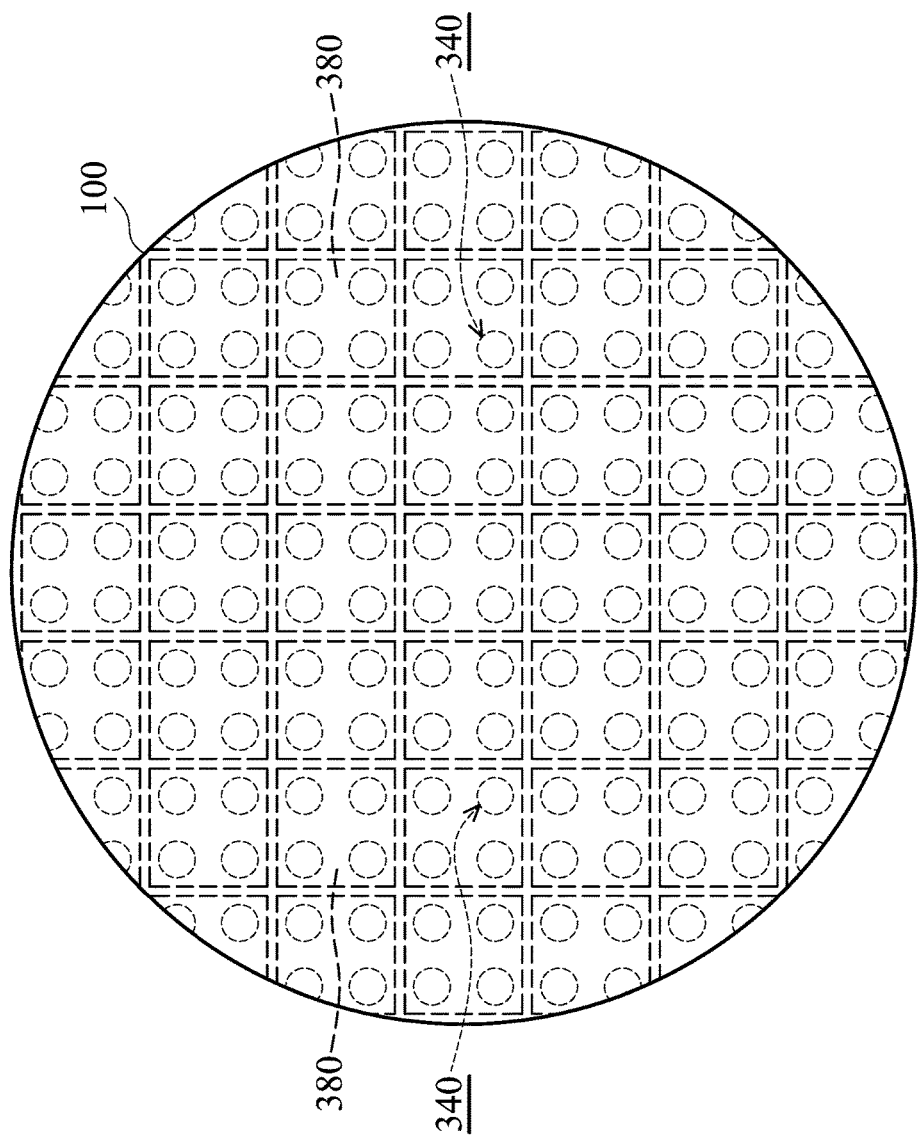
FIG. 2 is a top view of a group III-V device structure, in accordance with some embodiments of the disclosure.

FIG. 2 is a top view of a group III-V device structure, in accordance with some embodiments of the disclosure. FIG. 2 shows an example of the arrangement of recesses 340 (illustrated as dashed lines) but is not a limitation to the disclosure. The structure shown in FIG. 2 is the same as or similar to the structure illustrated in the aforementioned embodiments shown in FIGS. 1A-1L. In some embodiments, FIG. 1J is a cross-sectional view of a portion of the structure shown in FIG. 2. Some features of the structure shown in FIG. 1J are not shown in FIG. 2 for a better understanding of the structure.

As shown in FIG. 2, the semiconductor substrate 100 is a semiconductor wafer including multiple chip regions 380 (illustrated as dashed lines), in accordance with some embodiments. Each of the chip regions 380 includes one or more active device elements, such as transistors. For example, each of the chip regions 380 includes the structure shown in FIG. 1K. A singulation process, as mentioned above, will be performed along a scribe line between the chip regions 380 to form a semiconductor die including one or more active device elements in each of the chip regions 380.

In some embodiments, the recesses 340 correspond to the chip regions 380. For example, each of the recesses 340 corresponds to or overlaps one active device element in the chip regions 380. The recesses 340 may be arranged in a row, a column or an array. For the purpose of simplicity and clarity, FIG. 2 shows that there are four recesses 340 in each of the chip regions 380 as an example, but embodiments of the disclosure are not limited thereto. In some other embodiments, there are less or greater than four recesses 340 in each of the chip regions 380. The number of recesses 340 can be varied to meet requirements.

Many variations and/or modifications can be made to embodiments of the disclosure. For example, although FIG. 2 shows that there is no recess 340 corresponding to the scribe line between the chip regions 380, embodiments of the disclosure are not limited thereto. One of the recesses 340 may overlap the scribe line between two of the chip regions 380. One of the recesses 340 may overlap two or more of the chip regions 380.

Although FIG. 2 shows that each of the recesses 340 has a relatively rounded or circular top-view profile, embodiments of the disclosure are not limited thereto. In some other embodiments, the top-view profile of the recesses 340 is rectangular, square, oval, diamond, or another shape.

Figure 3:
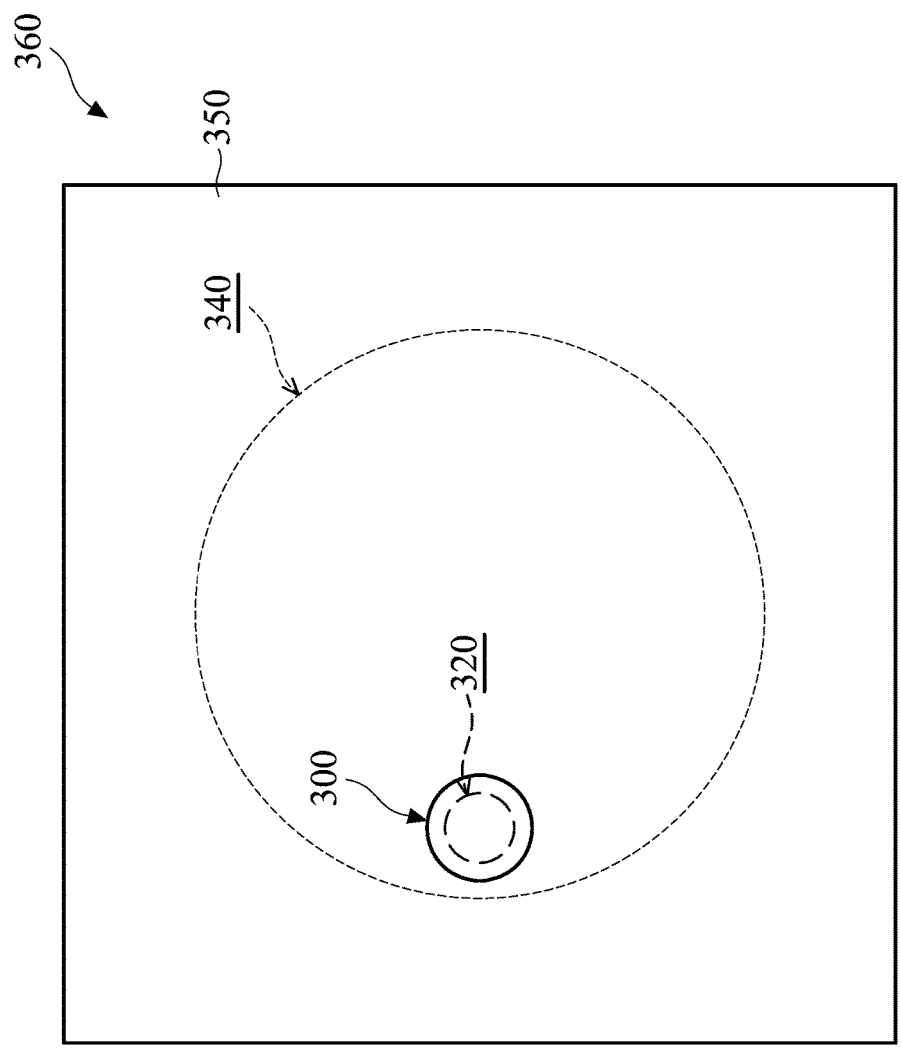
FIG. 3 is a top view of a group III-V device structure, in accordance with some embodiments of the disclosure.
Figure 4:
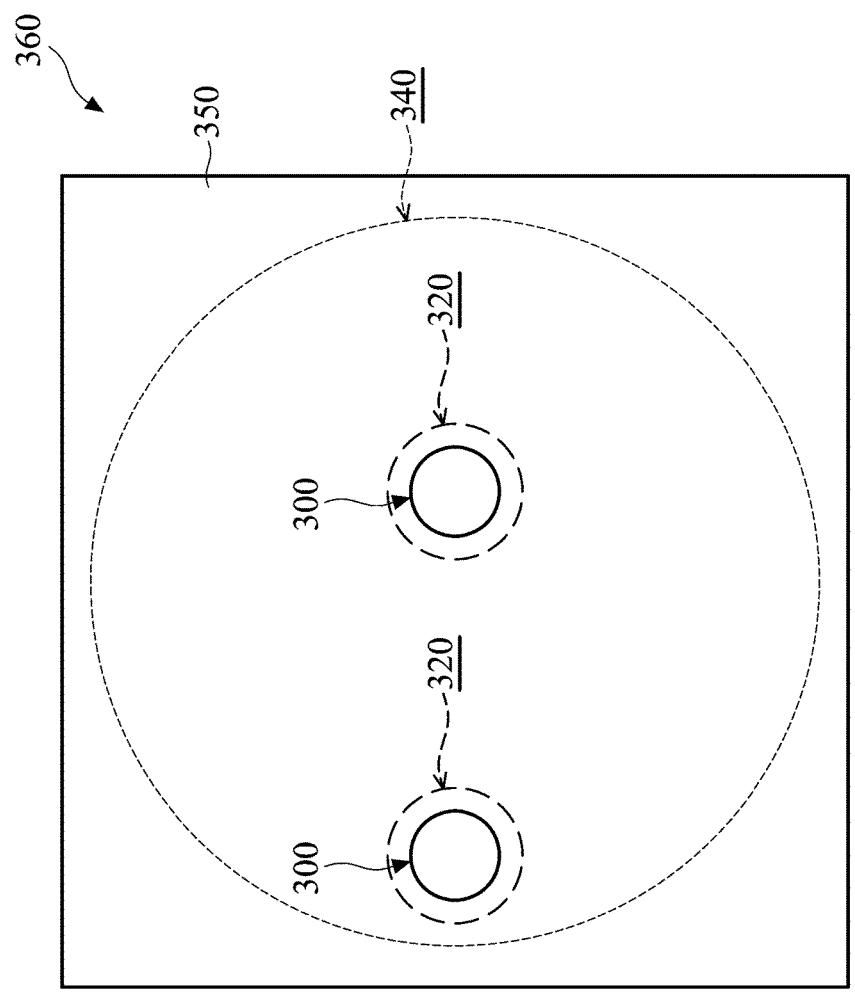
FIG. 4 is a top view of a group III-V device structure, in accordance with some embodiments of the disclosure.
Figure 5:
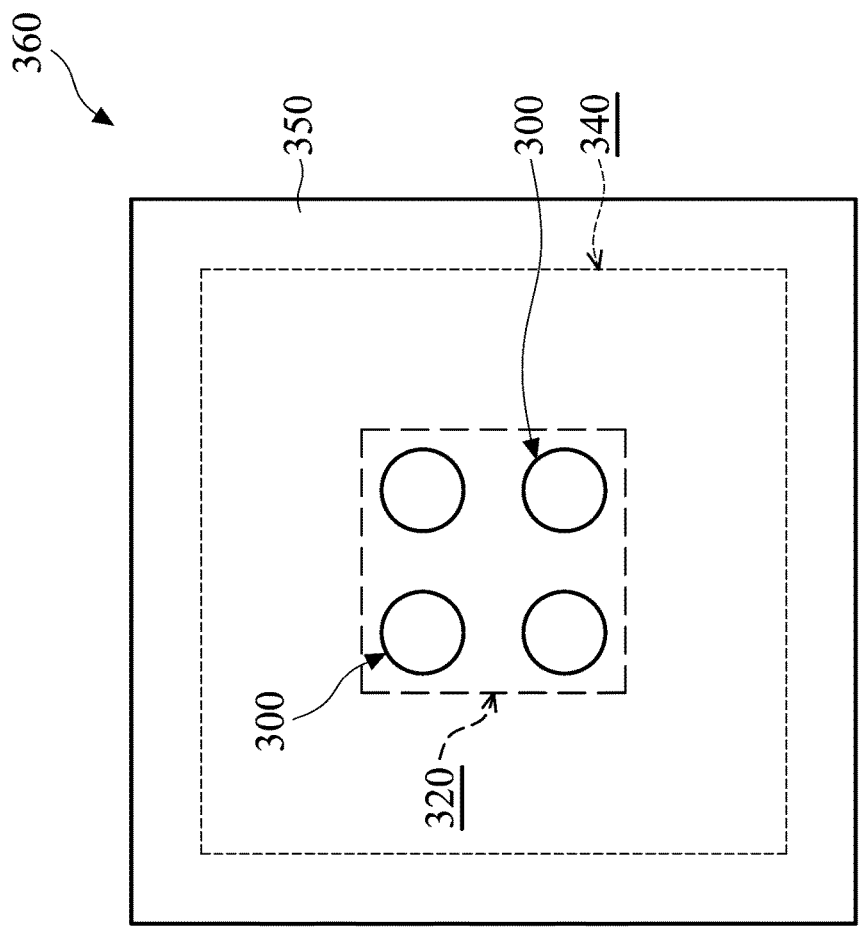
FIG. 5 is a top view of a group III-V device structure, in accordance with some embodiments of the disclosure.

FIGS. 3-5 are top views of a group III-V device structure, in accordance with some embodiments of the disclosure. FIGS. 3-5 show examples of the arrangement of the through via structure 300 and the through via structure 360, which includes the conductive layer 350 in the via hole 320 and the recess 340, but they are not a limitation to the disclosure. For a better understanding of the structure, the via hole 320 and the recess 340 are illustrated as dashed lines. The structures shown in FIGS. 3-5 are the same as or similar to the structure illustrated in the aforementioned embodiments shown in FIGS. 1A-1L and 2. In some embodiments, FIG. 1K is a cross-sectional view of a portion of the structure shown in FIG. 3, 4 or 5.

In some embodiments shown in FIG. 3, one via hole 320 is substantially aligned with or overlaps one through via structure 300. One recess 340 corresponds to or overlaps one via hole 320. The conductive layer 350 overlaps one through via structure 300, one via hole 320 and one recess 340.

In some embodiments shown in FIG. 4, one via hole 320 is substantially aligned with or overlaps one through via structure 300. One recess 340 corresponds to or overlaps two via holes 320. The conductive layer 350 overlaps two through via structures 300, two via holes 320 and one recess 340.

In some embodiments shown in FIG. 5, one via hole 320 is substantially aligned with or overlaps four through via structures 300. One recess 340 corresponds to or overlaps one via hole 320. The conductive layer 350 overlaps four through via structures 300, one via hole 320 and one recess 340. The number of through via structures 300, via holes 320 and recesses 340 can be varied to meet requirements.

In some embodiments, the through via structure 300, the via hole 320 and the recess 340 have substantially the same top-view profile, as shown in FIGS. 3 and 4. In some embodiments, the top-view profile of the through via structure 300 is different from the top-view profile of the via hole 320 and the recess 340, as shown in FIG. 5. The via hole 320 and the recess 340 may have substantially the same or different top-view profiles. The recess 340 has a greater area than the via hole 320, as shown in FIGS. 3-5.

FIGS. 3-5 show that the conductive layer 350 has a square top-view profile. The conductive layer 350 may be referred to as a conductive pad. However, embodiments of the disclosure are not limited thereto. In some other embodiments, the top-view profile of the conductive layer 350 is rectangular, relatively rounded, circular, oval, diamond, or another shape. The recess 340 and the conductive layer 350 may have substantially the same or different top-view profiles.

Many variations and/or modifications can be made to embodiments of the disclosure. For example, although the through via structure 300 described in FIGS. 1A-1L is formed during BEOL semiconductor fabrication processes, embodiments of the disclosure are not limited thereto. Some other embodiments of the disclosure form the through via structure 300 during FEOL semiconductor fabrication processes.

FIGS. 6A-6G are cross-sectional views of various stages of a process for forming a group III-V device structure, in accordance with some embodiments of the disclosure. In some embodiments, the materials and/or formation methods of the group III-V device structure shown in FIGS. 1A-1L can also be applied in the embodiments illustrated in FIGS. 6A-6G, and are therefore not repeated.

Figure 6A:
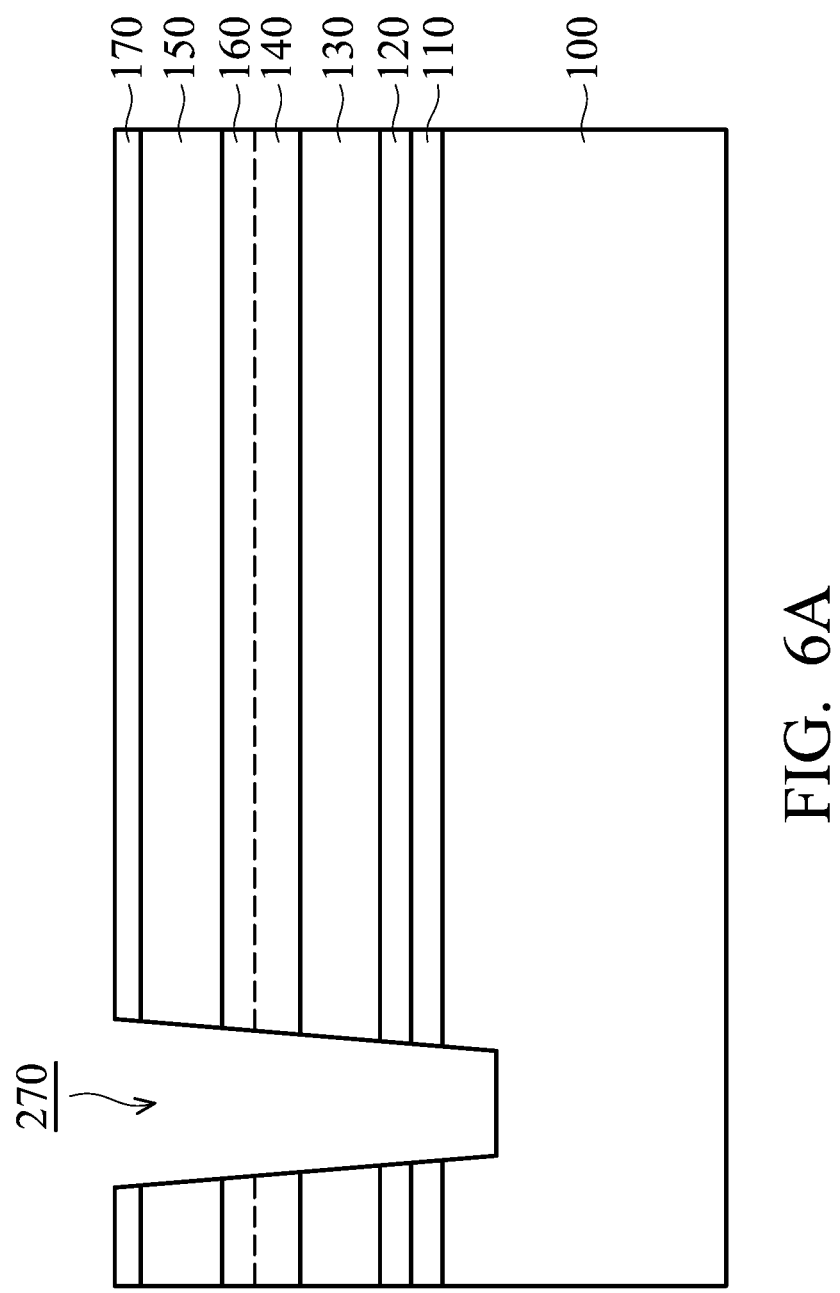
FIGS. 6A-6G are cross-sectional views of various stages of a process for forming a group III-V device structure, in accordance with some embodiments of the disclosure.

Processes similar to or the same as the embodiments illustrated in FIGS. 1A and 1B are performed to deposit the dielectric layer 170 on the active layer 150. Subsequently, processes similar to or the same as the embodiments illustrated in FIG. 1F are performed to form the trench 270, as shown in FIG. 6A in accordance with some embodiments. The trench 270 penetrates through the dielectric layer 170, the active layer 150, the channel layer 140, the buffer layer 130, the transition layer 120 and the nucleation layer 110.

Figure 6B:
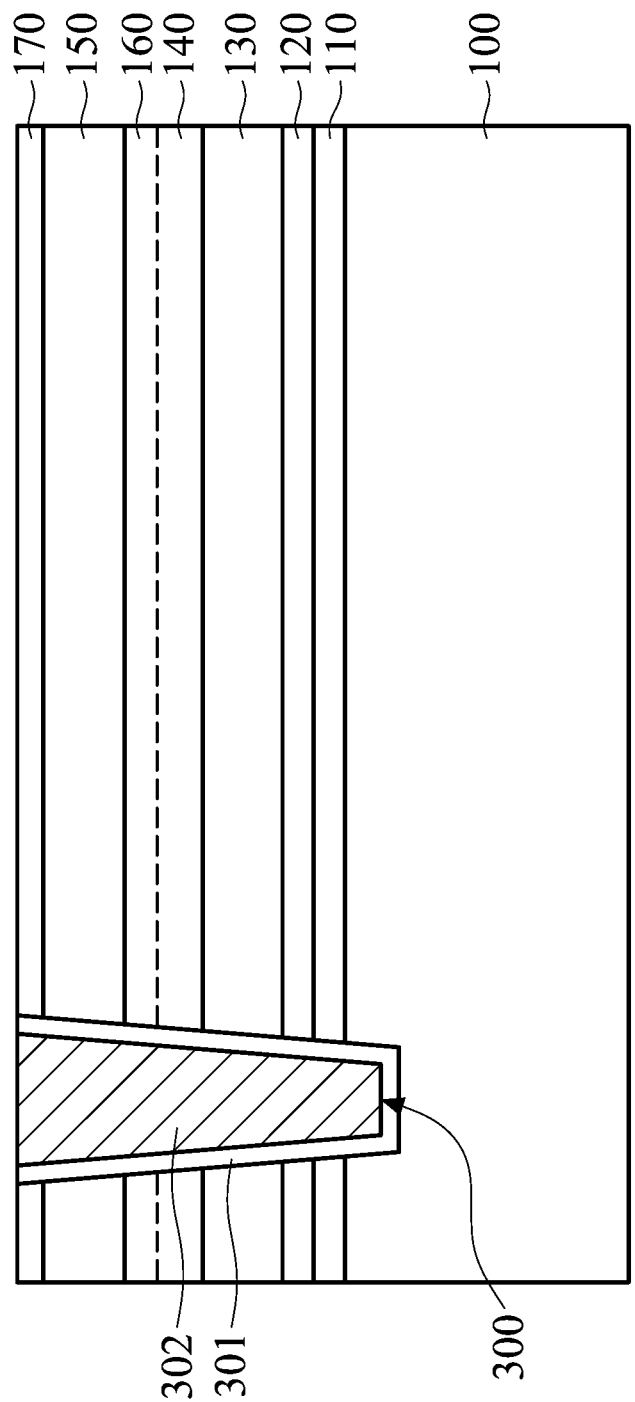

Afterwards, as shown in FIG. 6B, a diffusion barrier layer 301 and a conductive layer 302 are deposited in the trench 270 to form the through via structure 300, in accordance with some embodiments. The through via structure 300 is formed during FEOL semiconductor fabrication processes.

The diffusion barrier layer 301 is conformally deposited on the sidewalls and the bottom surface of the trench 270. The conductive layer 302 is then deposited on the diffusion barrier layer 301 to fill up the trench 270. Next, the excess of the diffusion barrier layer 301 and the conductive layer 302 outside of the trench 270 are removed, such as by a CMP process.

In some embodiments, the diffusion barrier layer 301 includes or is made of Ta, TaN, Ti, TiN, CoW, another suitable material, or a combination thereof. In some embodiments, the diffusion barrier layer 301 is deposited using a physical vapor deposition (PVD) process or another applicable process. In some embodiments, the conductive layer 302 includes or is made of tungsten (W), W alloy, Cu, Cu alloy, Al, Al alloys, another suitable material, or a combination thereof. The advantage of W is that W has a better trench filling ability, and thus W is easily filled into the trench 270 without the formation of voids. In some embodiments, the conductive layer 302 is deposited using an electroplating process, an electroless plating process, a sputtering process, or another applicable process.

Figure 6C:
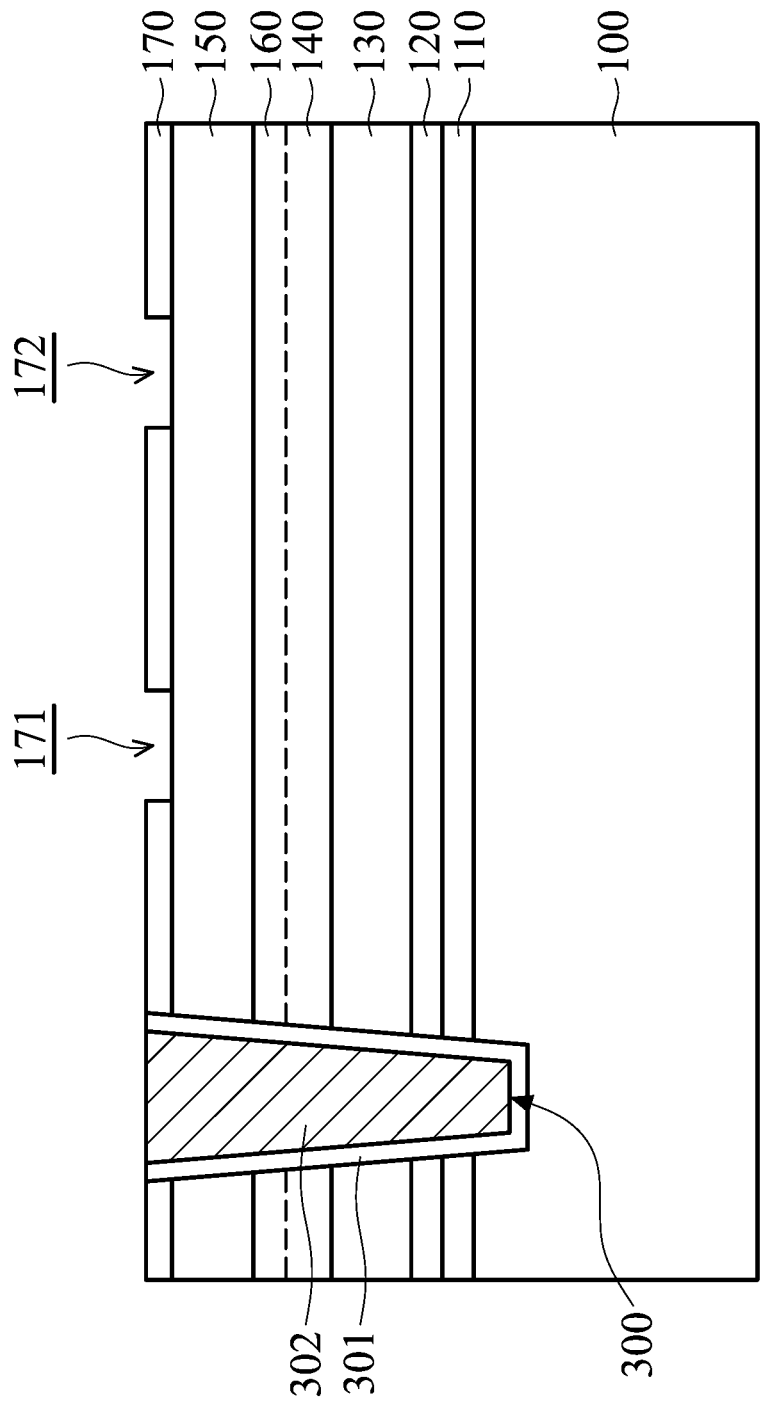
Figure 6D:
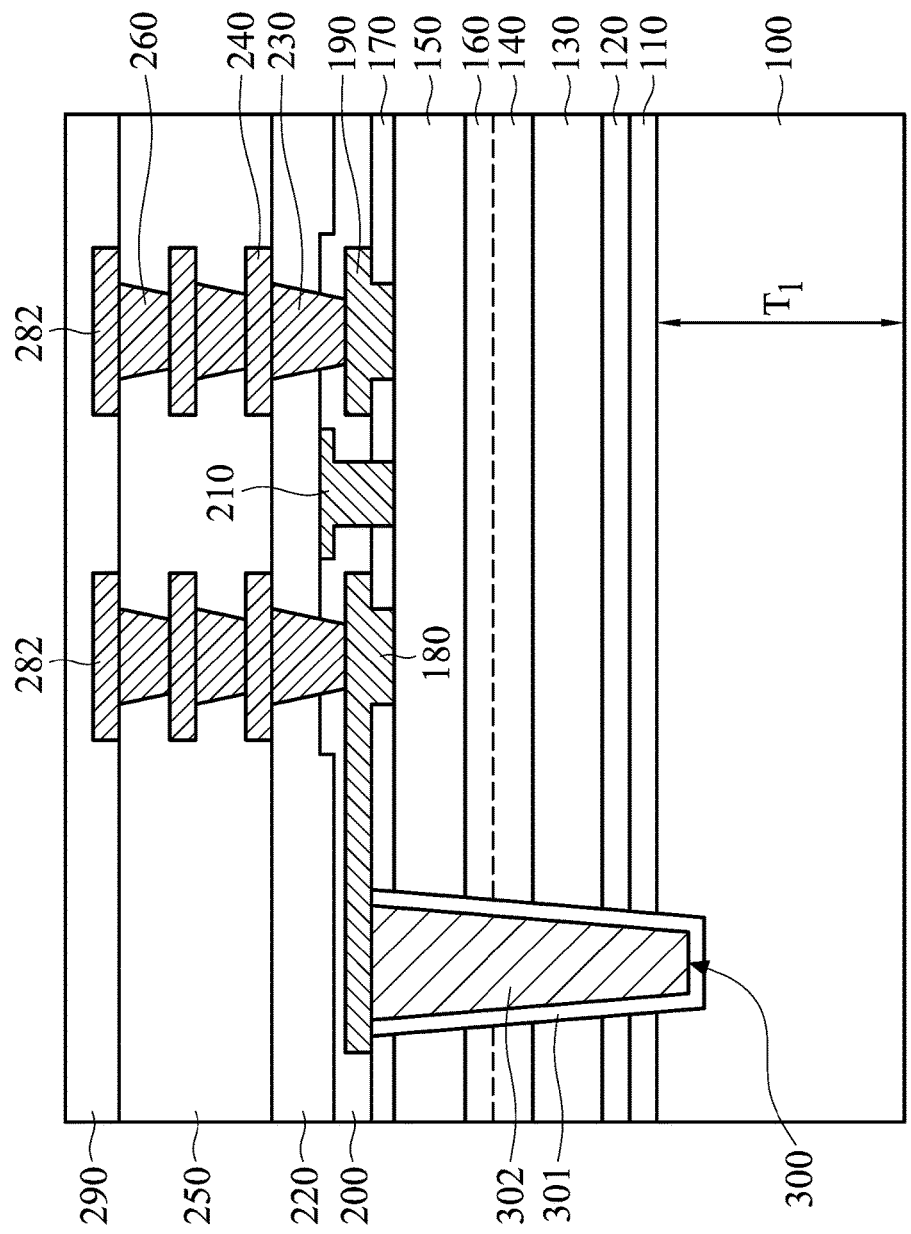

Afterwards, processes similar to or the same as the embodiments illustrated in FIG. 1B are performed to form the recess 171 and the recess 172 in the dielectric layer 170, as shown in FIG. 6C. Processes similar to or the same as the embodiments illustrated in FIGS. 1C-1E and 1G are performed to form the interconnection structure shown in FIG. 6D. In some embodiments, the source electrode 180 extends on the through via structure 300 to electrically and physically connect to the through via structure 300. In some embodiments, the through via structure 300 is separated from the dielectric layers 200, 220 and 250 and the passivation layer 290 by the source electrode 180.

Figure 6E:
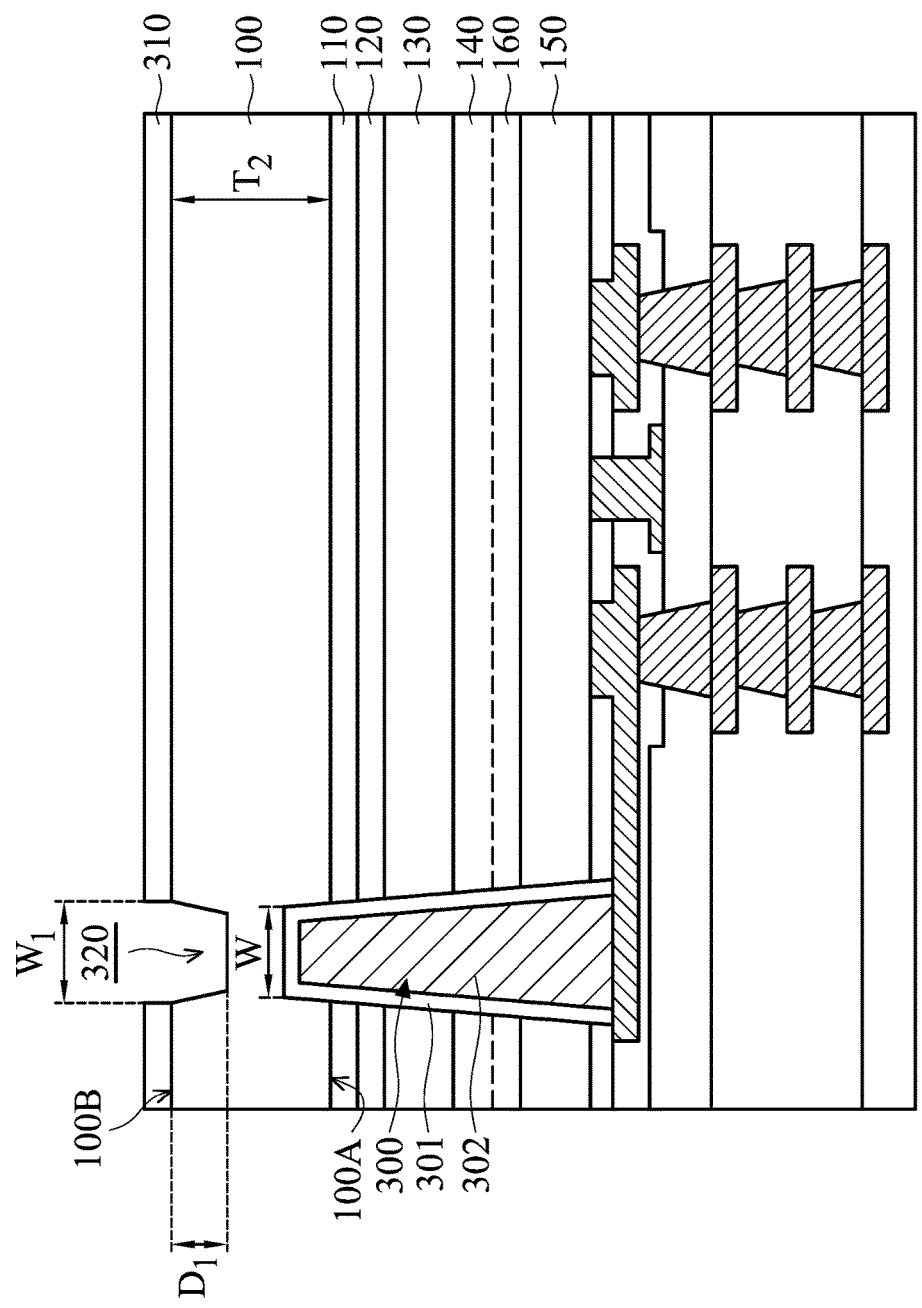

As shown in FIG. 6E, processes similar to or the same as the embodiments illustrated in FIGS. 1H and 1I are performed to thin the semiconductor substrate 100 and form the via hole 320 in the semiconductor substrate 100. In some embodiments, the top opening of the via hole 320 has a width $W_1$ that is greater than the width W of the through via structure 300. For example, FIG. 4 shows that the top-view profile of the via hole 320 has a greater area than the top-view profile of the through via structure 300.

Figure 6F:
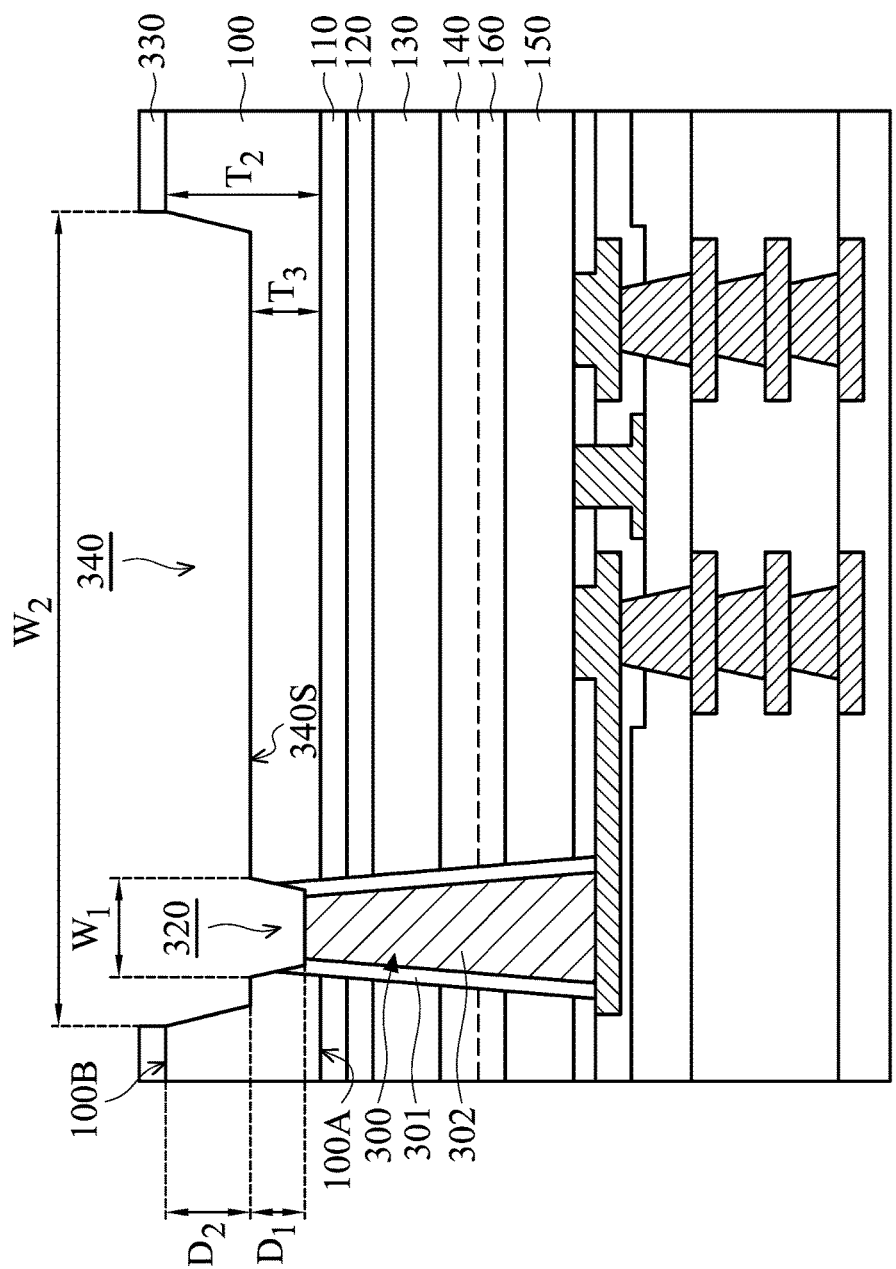

As shown in FIG. 6F, processes similar to or the same as the embodiments illustrated in FIG. 1J are performed to form the recess 340 in the semiconductor substrate 100. In some embodiments, the via hole 320 becomes extending from the bottom surface 340S of the recess 340 into the through via structure 300 after the formation of the recess 340. As a result, the diffusion barrier layer 301 and the conductive layer 302 of the through via structure 300 are exposed.

In some embodiments, the thickness $T_3$ of the semiconductor substrate 100 is greater than the depth $D_1$ of the via hole 320 but is less than the depth $D_2$ of the recess 340. The thickness $T_3$ of the semiconductor substrate 100 may be substantially equal to the depth $D_2$ of the recess 340.

As mentioned above, in some other embodiments, the through via structure 300 does not extend into the semiconductor substrate 100. In these embodiments, the sum of the depth $D_1$ of the via hole 320 and the depth $D_2$ of the recess 340 is greater than the thickness $T_2$ of the semiconductor substrate 100 when the via hole 320 extends into the through via structure 300.

As mentioned above, in accordance with some embodiments, the thickness $T_3$ of the semiconductor substrate 100 is in a range from about 20 μm to about 150 μm. In some cases, the thickness $T_3$ should be substantially equal to or less than about 150 μm. If the thickness $T_3$ is greater than about 150 μm, it may be difficult for the semiconductor substrate 100 to dissipate heat. However, embodiments of the disclosure are not limited thereto. In some other cases, the thickness $T_3$ may be greater than about 150 µm. In some cases, the thickness $T_3$ should be substantially equal to or greater than about 20 µm. If the thickness $T_3$ is less than about 20 µm, defect may be induced in the group III-V device structure due to lattice constant mismatch. However, embodiments of the disclosure are not limited thereto. In some other cases, the thickness $T_3$ may be less than about 20 µm.

Figure 6G:
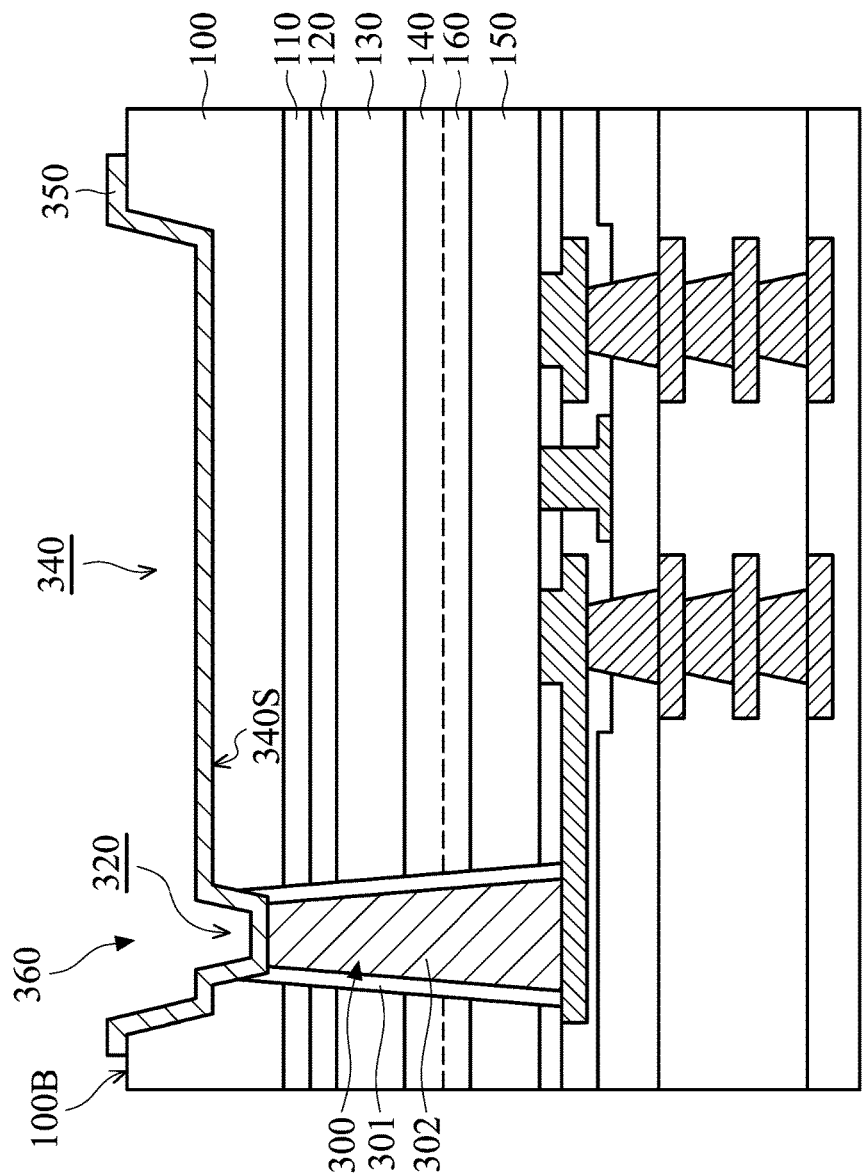

Afterwards, as shown in FIG. 6G, processes similar to or the same as the embodiments illustrated in FIG. 1K are performed to form the patterned conductive layer 350. The conductive layer 350 fills the recess 340 and the via hole 320 to form the through via structure 360. Subsequently, the structure shown in FIG. 6G is turned upside down and then is bonded onto the dicing tape 370. A singulation process is performed over the dicing tape 370 to separate the structure shown in FIG. 6G into multiple semiconductor dies.

Embodiments of the disclosure form a group III-V device structure including a first through via structure (such as a TGV) and a second through via structure (such as a TSV). Group III-V compound layers are deposited over the front surface of a semiconductor substrate. The first through via structure penetrates through the group III-V compound layers. The semiconductor substrate is thinned from its back surface until the semiconductor substrate has a first thickness that is measured from the back surface to the front surface of the semiconductor substrate. The first thickness is sufficient to avoid defect, which may be induced by lattice constant mismatch between the semiconductor substrate and the group III-V compound layers. As a result, no carrier substrate needs to be attached to the group III-V device structure before the thinning of the semiconductor substrate. Accordingly, the method for forming the group III-V device structure is simple and the fabrication cost is greatly reduced.

Afterwards, a via hole and a recess are formed in the semiconductor substrate to create a step-like space for the formation of the second though via structure. The via hole and the recess together penetrate through the semiconductor substrate. The semiconductor substrate has a second thickness that is measured from the bottom surface of the recess to the front surface of the semiconductor substrate.

The semiconductor substrate has a first portion that remains the first thickness. Warping, bending or even cracking in the group III-V device structure due to lattice constant mismatch is eliminated. The semiconductor substrate has a second portion, which is under the recess and has the second thickness less than the first thickness. As a result, it becomes easier for the semiconductor substrate to dissipate more heat. Accordingly, the reliability of the group III-V device structure is significantly enhanced.

In addition, the group III-V device structure is bonded to and electrically connected to a package substrate by the second though via structure, rather than conductive wires which are formed using a wire bonding process. As a result, the inductance and the contact resistance of the group III-V device structure are reduced. Therefore, the device performance of the group III-V device structure is significantly enhanced.

In accordance with some embodiments, a method for forming a group III-V device structure is provided. The method includes depositing group III-V compound layers over a front surface of a semiconductor substrate. The method also includes forming a first through via structure penetrating through the group III-V compound layers. The method further includes thinning the semiconductor substrate from a back surface of the semiconductor substrate. In addition, the method includes etching the semiconductor substrate from the back surface to form a via hole substantially aligned with the first through via structure. The method also includes etching the semiconductor substrate from the back surface to form a recess such that the via hole extends from a bottom surface of the recess towards the first through via structure until the first through via structure is exposed by the via hole and the recess. The method further includes forming a conductive layer over the back surface and in the via hole and the recess to form a second through via structure electrically connected to the first through via structure.

In accordance with some embodiments, a method for forming a group III-V device structure is provided. The method includes depositing a group III-V compound layer over a front surface of a semiconductor substrate. The method also includes forming a source electrode, a drain electrode and a gate structure over the group III-V compound layer. The method further includes forming a through via structure penetrating through the group III-V compound layer. In addition, the method includes etching the semiconductor substrate from a back surface of the semiconductor substrate to form a via hole overlapping the through via structure. The method also includes etching the semiconductor substrate from the back surface to form a recess overlapping the through via structure, the source electrode, the drain electrode and the gate structure. The through via structure is exposed by the via hole and the recess. The method further includes forming a first conductive layer over the back surface and in the via hole and the recess to electrically connect to the through via structure.

In accordance with some embodiments, a method for forming a group III-V device structure is provided. The method includes depositing group III-V compound layers over a front surface of a semiconductor substrate. The semiconductor substrate includes chip regions. The method also includes forming a gate structure over the group III-V compound layers in the chip regions. The method further includes forming a through via structure penetrating through the group III-V compound layers in the chip regions. In addition, the method includes partially removing the semiconductor substrate from a back surface of the semiconductor substrate to form a via hole in the chip regions. The method also includes partially removing the semiconductor substrate from the back surface to form a recess in the chip regions after the formation of the via hole such that the via hole and the recess form a step-like cavity. The step-like cavity exposes the through via structure and overlaps the gate structure. The method further includes forming a first conductive layer over the back surface and in the step-like cavity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a group III-V device structure, comprising:
    depositing group III-V compound layers over a front surface of a semiconductor substrate;
    depositing a first dielectric layer over the front surface of the semiconductor substrate to cover the group III-V compound layers;
    forming a source electrode and a drain electrode in the first dielectric layer;
    depositing a second dielectric layer covering the first dielectric layer to cover the source electrode and the drain electrode; and
    forming a gate structure between the source electrode and the drain electrode, wherein the gate structure penetrates through the first dielectric layer and the second dielectric layer;
    forming a first through via structure penetrating through the group III-V compound layers;
    thinning the semiconductor substrate from a back surface of the semiconductor substrate;
    etching the semiconductor substrate from the back surface to form a via hole substantially aligned with the first through via structure;
    etching the semiconductor substrate from the back surface to form a recess such that the via hole extends from a bottom surface of the recess towards the first through via structure until the first through via structure is exposed by the via hole and the recess, wherein the recess overlaps the source electrode, the drain electrode and the gate structure; and
    forming a conductive layer over the back surface and in the via hole and the recess to form a second through via structure electrically connected to the first through via structure.

2. The method for forming a group III-V device structure as claimed in claim 1, wherein the first through via structure is covered by the semiconductor substrate after the formation of the via hole, and the first through via structure becomes exposed from the semiconductor substrate after the formation of the recess.

3. The method for forming a group III-V device structure as claimed in claim 1,
    wherein the first through via structure penetrates further through the first dielectric layer; and
    wherein the semiconductor substrate is thinned to a first thickness measured from the back surface to the front surface of the semiconductor substrate, and a portion of the semiconductor substrate has a second thickness measured from the bottom surface of the recess to the front surface of the semiconductor substrate, and wherein the portion having the second thickness overlaps the gate structure.

4. The method for forming a group III-V device structure as claimed in claim 1, further comprising:
    depositing a passivation layer over the group III-V compound layers, wherein no carrier substrate is bonded to the passivation layer before and during the etching of the semiconductor substrate from the back surface.

5. The method for forming a group III-V device structure as claimed in claim 1, wherein no carrier substrate comprising a semiconductor material or a glass material supports the group III-V compound layers over the front surface of the semiconductor substrate during the formation of the conductive layer over the back surface of the semiconductor substrate.

6. The method for forming a group III-V device structure as claimed in claim 1,
    wherein the first through via structure is formed after the deposition of the first dielectric layer and before the formation of the source electrode and the drain electrode.

7. A method for forming a group III-V device structure, comprising:
    depositing a group III-V compound layer over a front surface of a semiconductor substrate;
    forming a source electrode, a drain electrode and a gate structure over the group III-V compound layer;
    forming a through via structure penetrating through the group III-V compound layer, wherein the through via structure is formed before the formation of the source electrode and the drain electrode;
    etching the semiconductor substrate from a back surface of the semiconductor substrate to form a via hole overlapping the through via structure;
    etching the semiconductor substrate from the back surface to form a recess overlapping the through via structure, the source electrode, the drain electrode and the gate structure, wherein the through via structure is exposed by the via hole and the recess; and
    forming a first conductive layer over the back surface and in the via hole and the recess to electrically connect to the through via structure.

8. The method for forming a group III-V device structure as claimed in claim 7, wherein the through via structure is covered by a portion of the semiconductor substrate after the formation of the via hole, and the portion of the semiconductor substrate is etched to expose the through via structure during the formation of the recess.

9. The method for forming a group III-V device structure as claimed in claim 7, wherein the semiconductor substrate comprises a first portion which overlaps the source electrode, the drain electrode and the gate structure, and wherein the semiconductor substrate further comprises a second portion which does not overlap the gate structure and is thicker than the first portion.

10. The method for forming a group III-V device structure as claimed in claim 7, further comprising:
    mounting the semiconductor substrate onto a dicing tape, wherein no de-bonding process is performed over the dicing tape.

11. The method for forming a group III-V device structure as claimed in claim 7, further comprising:
    depositing dielectric layers covering the group III-V compound layer;
    forming second conductive layers and conductive vias in the dielectric layers;
    depositing a passivation layer over the dielectric layers to cover the second conductive layers; and
    thinning the semiconductor substrate from the back surface of the semiconductor substrate after the deposition of the passivation layer,
    wherein no carrier substrate comprising a semiconductor material or a glass material is bonded to the passivation layer before and during the thinning of the semiconductor substrate.

12. The method for forming a group III-V device structure as claimed in claim 7, wherein the through via structure extends into the semiconductor substrate from the front surface of the semiconductor substrate, and wherein the via hole extends into the through via structure from a bottom surface of the recess.

13. The method for forming a group III-V device structure as claimed in claim 7, wherein the formation of the through via structure comprises:
   forming a trench in the group III-V compound layer;
   forming a diffusion barrier layer in the trench; and
   forming a second conductive layer over the diffusion barrier layer to fill up the trench,
   wherein the source electrode extends on the through via structure to physically connect to the second conductive layer and the diffusion barrier.

14. A method for forming a group III-V device structure, comprising:
   depositing group III-V compound layers over a front surface of a semiconductor substrate, wherein the semiconductor substrate comprises chip regions;
   forming a gate structure over the group III-V compound layers in the chip regions;
   forming a through via structure penetrating through the group III-V compound layers in the chip regions;
   partially removing the semiconductor substrate from a back surface of the semiconductor substrate to form a via hole in the chip regions;
   partially removing the semiconductor substrate from the back surface to form a recess in the chip regions after the formation of the via hole such that the via hole and the recess form a step-like cavity, wherein the step-like cavity exposes the through via structure and overlaps the gate structure; and
   forming a first conductive layer over the back surface and in the step-like cavity.

15. The method for forming a group III-V device structure as claimed in claim 14, wherein the recess has a greater area in the chip regions than the via hole.

16. The method for forming a group III-V device structure as claimed in claim 14, further comprising:
   cutting the semiconductor substrate between the chip regions, wherein the recess of the step-like cavity is formed within the chip regions without being cut during the cutting of the semiconductor substrate.

17. The method for forming a group III-V device structure as claimed in claim 14, further comprising:
   forming a second through via structure penetrating through the group III-V compound layers in the chip regions, wherein the step-like cavity overlaps the second through via structure, the through via structure and the gate structure.

18. The method for forming a group III-V device structure as claimed in claim 14, further comprising:
   depositing a passivation layer over the group III-V compound layers in the chip regions; and
   thinning the semiconductor substrate from the back surface of the semiconductor substrate after the deposition of the passivation layer,
   wherein no adhesive layer is attached to the passivation layer in the chip regions before the thinning of the semiconductor substrate.

19. The method for forming a group III-V device structure as claimed in claim 14, further comprising:
   forming a source electrode and a drain electrode over the group III-V compound layers in the chip regions;
   depositing dielectric layers covering the source electrode, the drain electrode and the gate structure;
   forming second conductive layers and conductive vias in the dielectric layers; and
   depositing a passivation layer over the dielectric layers to cover the second conductive layers,
   wherein the through via structure in the group III-V compound layers is separated from the dielectric layers and the passivation layer by the source electrode.

20. The method for forming a group III-V device structure as claimed in claim 14, wherein the semiconductor substrate comprises a first portion which overlaps the gate structure, and wherein the semiconductor substrate further comprises a second portion which does not overlap the gate structure and is thicker than the first portion, and the first portion is surrounded by the second portion.

* * * * *